United States Patent
Yamazaki et al.

(10) Patent No.: US 9,613,964 B2
(45) Date of Patent: Apr. 4, 2017

(54) SEMICONDUCTOR DEVICE INCLUDING A MEMORY CELL

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 665 days.

(21) Appl. No.: 13/034,278

(22) Filed: Feb. 24, 2011

(65) Prior Publication Data
US 2011/0210339 A1 Sep. 1, 2011

(30) Foreign Application Priority Data
Feb. 26, 2010 (JP) .................. 2010-041852

(51) Int. Cl.
*H01L 27/108* (2006.01)
*H01L 27/105* (2006.01)
(Continued)

(52) U.S. Cl.
CPC .......... *H01L 27/105* (2013.01); *G11C 11/24* (2013.01); *H01L 27/1052* (2013.01);
(Continued)

(58) Field of Classification Search
CPC H01L 27/105; H01L 27/108; H01L 27/10808
(Continued)

(56) References Cited

U.S. PATENT DOCUMENTS 4,375,600 A * 3/1983 Wu ................. G11C 11/34
327/387
4,466,081 A 8/1984 Masuoka
(Continued)

FOREIGN PATENT DOCUMENTS

CN 101258607 A 9/2008
CN 101859711 A 10/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Matthew E Warren
(74) *Attorney, Agent, or Firm* — Fish & Richardson P.C.

(57) ABSTRACT

A semiconductor device including a non-volatile memory cell including a writing transistor which includes an oxide semiconductor, a reading transistor which includes a semiconductor material different from that of the writing transistor, and a capacitor is provided. Data is written or rewritten to the memory cell by turning on the writing transistor and supplying a potential to a node where a source electrode (or a drain electrode) of the writing transistor, one electrode of the capacitor, and a gate electrode of the reading transistor are electrically connected to each other, and then turning off the writing transistor so that the predetermined amount of charge is held in the node. Further, when a transistor whose threshold voltage is controlled and set to a positive voltage is used as the reading transistor, a reading potential is a positive potential.

21 Claims, 17 Drawing Sheets

(51) Int. Cl.
  *G11C 11/24* (2006.01)
  *H01L 27/1156* (2017.01)
  *H01L 27/12* (2006.01)
  *H01L 49/02* (2006.01)

(52) U.S. Cl.
  CPC ........ *H01L 27/1156* (2013.01); *H01L 27/108* (2013.01); *H01L 27/10808* (2013.01); *H01L 27/1225* (2013.01); *H01L 28/60* (2013.01)

(58) Field of Classification Search
  USPC ........ 257/296, 298, 306, 390, 391, E29.068, 257/E29.17
  See application file for complete search history.

(56) References Cited

U.S. PATENT DOCUMENTS

| | | | |
|---|---|---|---|
| 5,377,142 A * | 12/1994 | Matsumura | G11C 11/405 365/149 |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,314,017 B1 | 11/2001 | Emori et al. | |
| 6,445,026 B1 * | 9/2002 | Kubota | G11C 11/403 257/296 |
| 6,536,013 B2 | 3/2003 | Kobayashi et al. | |
| 6,563,174 B2 | 5/2003 | Kawasaki et al. | |
| 6,727,522 B1 | 4/2004 | Kawasaki et al. | |
| 6,744,087 B2 * | 6/2004 | Misewich | G11C 11/22 257/295 |
| 7,049,190 B2 | 5/2006 | Takeda et al. | |
| 7,057,912 B2 | 6/2006 | Hanzawa et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,468,901 B2 | 12/2008 | Kameshiro et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,859,889 B2 | 12/2010 | Kameshiro et al. | |
| 7,935,582 B2 | 5/2011 | Iwasaki | |
| 7,956,361 B2 | 6/2011 | Iwasaki | |
| 7,994,500 B2 | 8/2011 | Kim et al. | |
| 8,178,926 B2 | 5/2012 | Nakayama | |
| 8,530,246 B2 | 9/2013 | Ofuji et al. | |
| 8,541,258 B2 | 9/2013 | Kim et al. | |
| 8,659,016 B2 | 2/2014 | Kim et al. | |
| 8,742,412 B2 | 6/2014 | Goyal et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0127380 A1 | 6/2005 | Kawasaki et al. | |
| 2005/0128803 A1 | 6/2005 | Luk et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0198210 A1 | 9/2006 | Hanzawa et al. | |
| 2006/0208977 A1 | 9/2006 | Kimura | |
| 2006/0227648 A1 | 10/2006 | Kameshiro et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0321732 A1 | 12/2009 | Kim et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |
| 2011/0076790 A1 | 3/2011 | Ofuji et al. | |
| 2011/0101351 A1 | 5/2011 | Yamazaki | |
| 2011/0122673 A1 | 5/2011 | Kamata et al. | |
| 2011/0134683 A1 | 6/2011 | Yamazaki et al. | |

FOREIGN PATENT DOCUMENTS

| | | |
|---|---|---|
| EP | 1134811 A | 9/2001 |
| EP | 1 737 044 A1 | 12/2006 |
| EP | 1746659 A | 1/2007 |
| EP | 1976018 A | 10/2008 |

(56) References Cited

FOREIGN PATENT DOCUMENTS

| | | |
|---|---|---|
| EP | 2141744 A | 1/2010 |
| EP | 2 226 847 A2 | 9/2010 |
| JP | 56-162875 A | 12/1981 |
| JP | 57-105889 A | 7/1982 |
| JP | 60-198861 A | 10/1985 |
| JP | 62-230043 A | 10/1987 |
| JP | 63-070558 A | 3/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-101556 A | 10/1991 |
| JP | 05-251705 A | 9/1993 |
| JP | 07-141882 A | 6/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-53164 A | 2/2001 |
| JP | 2001-053167 A | 2/2001 |
| JP | 2001-230329 A | 8/2001 |
| JP | 2001-351386 A | 12/2001 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-355691 A | 12/2004 |
| JP | 2006-294116 A | 10/2006 |
| JP | 2007-103918 A | 4/2007 |
| JP | 2009-206508 A | 9/2009 |
| JP | 2009-212497 A | 9/2009 |
| JP | 2009-277702 A | 11/2009 |
| JP | 2010-016347 A | 1/2010 |
| JP | 2010-028021 A | 2/2010 |
| JP | 2010-183108 A | 8/2010 |
| KR | 2008-0053355 A | 6/2008 |
| TW | 503563 | 9/2002 |
| TW | 200405549 | 4/2004 |
| WO | WO-00/30183 | 5/2000 |
| WO | 2004/114391 A1 | 12/2004 |
| WO | 2007/029844 A1 | 3/2007 |
| WO | WO-2009/096608 | 8/2009 |
| WO | WO-2009/139482 | 11/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo

(56) References Cited

OTHER PUBLICATIONS

Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

(56) References Cited

OTHER PUBLICATIONS

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.
Kim, W et al., "An Experimental High-Density DRAM Cell with a Built-in Gain Stage," IEEE Journal of Solid-State Circuits, Aug. 1, 1994, vol. 29, No. 8, pp. 978-981.
Shukuri, S et al., "A Complementary Gain Cell Technology for Sub-1 V Supply DRAMs," IEDM 92: Technical Digest of International Electron Devices Meeting, Dec. 13, 1992, pp. 1006-1008.
Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.
International Search Report, PCT Application No. PCT/JP2011/053619, dated May 31, 2011, 4 pages.
Written Opinion, PCT Application No. PCT/JP2011/053619, dated May 31, 2011, 4 pages.
Carr.W et al., MOS/LSI Design and Application, May 10, 1981, pp. 65-67, Electronics Digest Corporation, with English Translation.
Taiwanese Office Action (Application No. 100106196) Dated Jan. 7, 2016.
Taiwanese Office Action (Application No. 100106196) Dated Oct. 14, 2016.

\* cited by examiner

| | | 1st Row Writing (1,1) "1" (1,2) "0" | 1st Row Reading (1,1) "1" (1,2) "0" |
|---|---|---|---|
| S1(1) | V2 / 0V | | |
| S1(2) | V2 / 0V | | |
| S2(1) | V3 / 0V | | |
| S2(2) | V3 / 0V | | |
| BL(1) | Vdd / 0V | | |
| BL(2) | Vdd / 0V | | |
| WL(1) | V5 / 0V | | |
| WL(2) | V5 / 0V | | |
| SL(1),SL(2) | V1 / 0V | | |
| D(1) | Vdd / 0V | high impedance | |
| D(2) | Vdd / 0V | high impedance | |

SEMICONDUCTOR DEVICE INCLUDING A MEMORY CELL

TECHNICAL FIELD

The disclosed invention relates to a semiconductor device using a semiconductor element and a method for manufacturing the semiconductor device.

BACKGROUND ART

Memory devices using semiconductor elements can be broadly classified into two categories: a volatile memory device that loses stored data when power supply stops, and a non-volatile memory device that holds stored data even when power is not supplied.

An example of a volatile memory device is a dynamic random access memory (DRAM). A DRAM stores data in such a manner that a transistor included in a memory element is selected and charge is accumulated in a capacitor.

When data is read from a DRAM, charge in a capacitor is lost (or reduced) on the above-described principle; thus, another writing operation is needed whenever data is read out. A data holding period is short because charge flows from/into a transistor forming a memory element by leakage current between a source and a drain in an off state (off current) or the like even when the transistor is not selected. For that reason, another writing operation (refresh operation) is needed at predetermined intervals, and it is difficult to sufficiently reduce power consumption. Furthermore, since stored data is lost when power supply stops, an additional memory device using a magnetic material or an optical material is needed in order to hold the data for a long time.

Another example of a volatile memory device is a static random access memory (SRAM). An SRAM holds stored data by using a circuit such as a flip-flop and thus does not need refresh operation, which is an advantage over a DRAM. However, cost per memory capacity is increased because a circuit such as a flip-flop is used. Moreover, as in a DRAM, stored data in an SRAM is lost when power supply stops.

An example of a non-volatile memory device is a flash memory. A flash memory includes a floating gate between a gate electrode and a channel formation region of a transistor and stores data by holding charge in the floating gate. Therefore, a flash memory has advantages in that the data holding period is extremely long (almost permanent) and refresh operation which is needed in a volatile memory device is not needed (e.g., see Patent Document 1).

However, a gate insulating layer included in a memory element deteriorates by tunneling current generated in writing, so that the memory element stops its function after a predetermined number of times of writing. In order to reduce effects of this problem, a method in which the number of times of writing for memory elements is equalized is employed, for example. However, a complicated peripheral circuit is needed to realize this method. Moreover, employing such a method does not solve the fundamental problem of lifetime.

In addition, high voltage is needed for holding of charge in the floating gate or removal of the charge, and a circuit for generating high voltage is also needed. Further, it takes a relatively long time to hold or remove charge, and it is not easy to perform writing and erasing at higher speed.

REFERENCE

Patent Document

[Patent Document 1] Japanese Published Patent Application No. S57-105889

DISCLOSURE OF INVENTION

In view of the foregoing problems, an object of an embodiment of the disclosed invention is to provide a semiconductor device with a novel structure in which stored data can be held even when power is not supplied, and does not have a limitation on the number of times of writing.

In an embodiment of the disclosed invention, a semiconductor device is formed using a material which can sufficiently reduce off current of a transistor, e.g., an oxide semiconductor material which is a wide bandgap semiconductor. By using a semiconductor material which can sufficiently reduce off current of a transistor, it is possible to hold data for a long time.

Further, an embodiment of the disclosed invention provides a semiconductor device including a memory cell including a writing transistor which includes an oxide semiconductor, a reading transistor which includes a semiconductor material different from that of the writing transistor, and a capacitor. The memory cell is preferably non-volatile. Data is written or rewritten to the memory cell by turning on the writing transistor and supplying a potential to a node where one of a source electrode and a drain electrode of the writing transistor, one electrode of the capacitor, and a gate electrode of the reading transistor are electrically connected to each other, and then turning off the writing transistor so that the predetermined amount of charge is held in the node. Further, when a transistor whose threshold voltage is controlled and set to a positive voltage is used as the reading transistor, a reading potential is a positive potential.

More specifically, the following structures can be employed, for example.

An embodiment of the present invention is a semiconductor device comprising a source line; a bit line; a first signal line; a second signal line; a word line; and a memory cell connected between the source line and the bit line. The memory cell comprises a first transistor comprising a first gate electrode, a first source electrode, a first drain electrode, and a first channel formation region; a second transistor comprising a second gate electrode, a second source electrode, a second drain electrode, and a second channel formation region; and a capacitor. The first channel formation region includes a semiconductor material different from a semiconductor material of the second channel formation region and an impurity element imparting a conductivity type is added to the first channel formation region so that a threshold voltage of the first transistor is positive. The first gate electrode, the second drain electrode, and one of electrodes of the capacitor are electrically connected to each other to form a node holding charge, the source line is electrically connected to the first source electrode, the bit line is electrically connected to the first drain electrode, the first signal line is electrically connected to the second source electrode, the second signal line is electrically connected to the second gate electrode, and the word line is electrically connected to the other of the electrodes of the capacitor.

In the semiconductor device, one of a plurality of kinds of charges for controlling conductance of the first transistor is preferably supplied to the node.

In the semiconductor device, when a potential of 0 V is supplied to the word line, the threshold voltage of the first transistor is preferably a voltage at which the first transistor is turned off regardless of the charge held in the node.

In the semiconductor device, the second channel formation region preferably includes an oxide semiconductor.

In the semiconductor device, the first channel formation region preferably includes silicon, and at least one of boron, aluminum, and gallium is preferably added as the impurity element.

Note that although a transistor is formed using an oxide semiconductor in the above description, the disclosed invention is not limited thereto. A material which can realize the off-current characteristics equivalent to those of the oxide semiconductor, such as a wide gap material like silicon carbide (more specifically, a semiconductor material with an energy gap Eg of greater than 3 eV) may be used.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since off current of a transistor including an oxide semiconductor is extremely low, stored data can be held for an extremely long time by using the transistor. In other words, power consumption can be sufficiently reduced because refresh operation becomes unnecessary or the frequency of refresh operation can be extremely low. In addition, even in the case where power is not supplied (note that a potential is preferably fixed), stored data can be held for a long time.

Further, a semiconductor device according to an embodiment of the disclosed invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to an embodiment of the present invention does not have a limit on the number of times of rewriting which is a problem in a conventional non-volatile memory, and reliability thereof is drastically improved. Furthermore, data is written depending on the on state and the off state of the transistor, whereby high-speed operation can be easily realized. In addition, there is no need of operation for erasing data.

In addition, because a transistor including a material other than an oxide semiconductor can be sufficiently operated at high speed, operation speed of a semiconductor device (e.g., data read operation) can be sufficiently high by combining the transistor including a material other than an oxide semiconductor with a transistor including an oxide semiconductor. Further, a transistor including a material other than an oxide semiconductor can favorably realize a variety of circuits (such as a logic circuit or a driver circuit) which are required to operate at high speed.

In this manner, a semiconductor device having a novel feature can be realized by including both the transistor including a material other than an oxide semiconductor (in other words, the transistor which can operate at sufficiently high speed) and the transistor including an oxide semiconductor (in a broad sense, the transistor whose off current is sufficiently low).

BRIEF DESCRIPTION OF DRAWINGS

In the accompanying drawings:

FIG. 2 is a circuit diagram of a semiconductor device;

BEST MODE FOR CARRYING OUT THE INVENTION

Figures 1, 1A:
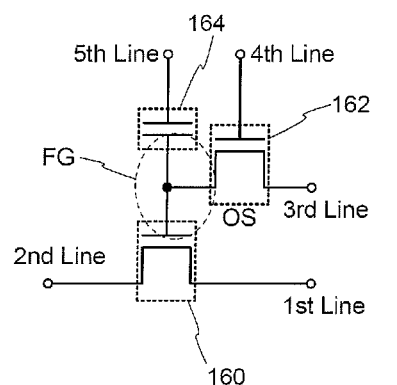
FIGS. 1A-1, 1A-2, and FIG. 1B are circuit diagrams of semiconductor devices.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

[Embodiment 1]

In this embodiment, a circuit configuration and operation of a semiconductor device according to an embodiment of the disclosed invention will be described with reference to FIGS. 1A-1, 1A-2, and 1B. Note that in each of circuit diagrams, in some cases, "OS" is written beside a transistor in order to indicate that the transistor includes an oxide semiconductor.

In a semiconductor device illustrated in FIG. 1A-1, a first wiring (a 1st Line, also referred to as a source line) and a source electrode of a transistor 160 are electrically connected to each other, and a second wiring (a 2nd Line, also referred to as a bit line) and a drain electrode of the transistor 160 are electrically connected to each other. In addition, a third wiring (a 3rd Line, also referred to as a first signal line) and one of a source electrode and a drain electrode of a transistor 162 are electrically connected to each other, and a fourth wiring (a 4th Line, also referred to as a second signal line) and a gate electrode of the transistor 162 are electrically connected to each other. Furthermore, a gate electrode of the transistor 160 and the other of the source electrode and the drain electrode of the transistor 162 are electrically connected to one of electrodes of a capacitor 164. A fifth wiring (a 5th Line, also referred to as a word line) and the other electrode of the capacitor 164 are electrically connected to each other.

Here, a transistor including an oxide semiconductor is used as the transistor 162 (writing transistor). A transistor including an oxide semiconductor has a characteristic of a significantly small off current. For that reason, the potential of the gate electrode of the transistor 160 can be held for an extremely long time by turning off the transistor 162. By providing the capacitor 164, holding of charge supplied to the gate electrode of the transistor 160 and reading of held data can be performed more easily.

Note that there is no particular limitation on the transistor 160 (reading transistor). In terms of increasing speed of reading data, it is preferable to use, for example, a transistor with high switching rate such as a transistor including single crystal silicon.

Figure 1B:
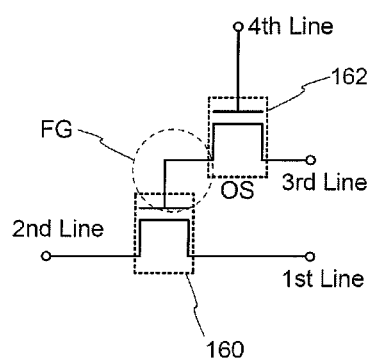

Further, as illustrated in FIG. 1B, a structure without the capacitor 164 may also be employed.

The semiconductor device in FIG. 1A-1 utilizes a characteristic in which the potential of the gate electrode of the transistor 160 can be held, whereby writing, holding, and reading of data can be performed as follows.

Firstly, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, a predetermined charge is supplied to the gate electrode of the transistor 160 (writing). Here, one of two kinds of charges for supplying different potentials is supplied (hereinafter, a charge for supplying a low potential is referred to as a charge $Q_L$ and a charge for supplying a high potential is referred to as a charge $Q_H$). Note that charges giving three or more different potentials may be applied to improve a memory capacitor. After that, the potential of the fourth wiring is set to a potential at which the transistor 162 is turned off, so that the transistor 162 is turned off. Thus, the charge given to the gate electrode of the transistor 160 is held (holding).

Since the off current of the transistor 162 is extremely small, the charge of the gate electrode of the transistor 160 is held for a long time.

Secondly, reading of data will be described. By supplying an appropriate potential (reading potential) to the fifth wiring while a predetermined potential (constant potential) is supplied to the first wiring, the potential of the second wiring varies depending on the amount of charge held at the gate electrode of the transistor 160. That is, the conductance of the transistor 160 is controlled by the charge held in the gate electrode (which can also be referred to as a node FG) of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold value refers to the potential of the fifth wiring which is needed to turn on the transistor 160. Thus, the potential of the fifth wiring is set to a potential $V_0$ intermediate between $V_{th\_H}$ and $V_{th\_L}$, whereby charge given to the gate electrode of the transistor 160 can be determined. For example, in the case where $Q_H$ is given in writing, when the potential of the fifth wiring is set to $V_0$ ($>V_{th\_H}$), the transistor 160 is turned on. In the case where $Q_L$ is given in writing, even when the potential of the fifth wiring is set to $V_0$ ($<V_{th\_L}$), the transistor 160 remains in an off state. Therefore, the held data can be read by the potential of the second wiring.

Note that in the case where memory cells are arrayed to be used, only data of desired memory cells is needed to be read. Thus, in order that data of predetermined memory cells are read and data of the other memory cells is not read, in the case where the transistors 160 are connected in parallel between the memory cells, a potential at which the transistor 160 is turned off regardless of a state of the gate electrode, that is, a potential lower than $V_{th\_H}$ may be supplied to fifth wirings of the memory cells whose data is not to be read. In the case where the transistors 160 are connected in series between the memory cells, potential at which the transistor 160 is turned on regardless of the state of the gate electrode, that is, a potential higher than $V_{th\_L}$ may be supplied to the fifth wirings of the memory cells whose data is not to be read.

Thirdly, rewriting of data will be described. Rewriting of data is performed in a manner similar to that of the writing and holding of data. That is, the potential of the fourth wiring is set to a potential at which the transistor 162 is turned on, whereby the transistor 162 is turned on. Accordingly, the potential of the third wiring (potential related to new data) is supplied to the gate electrode of the transistor 160 and the capacitor 164. After that, the potential of the fourth wiring is set to a potential at which the transistor 162 is turned off, whereby the transistor 162 is turned off. Accordingly, a charge related to new data is supplied to and kept in the gate electrode of the transistor 160.

In the semiconductor device according to an embodiment of the disclosed invention, data can be directly rewritten by another writing of data as described above. Therefore, extracting of charge from a floating gate with the use of high voltage needed in a flash memory or the like is not necessary and thus, reduction in operation speed caused by erasing operation can be suppressed. In other words, high-speed operation of the semiconductor device can be realized.

Note that the drain electrode (or the source electrode) of the transistor 162 is electrically connected to the gate electrode of the transistor 160, thereby having an effect similar to that of a floating gate of a floating gate transistor used for a non-volatile memory element. In the description below, a portion where the drain electrode (or the source electrode) of the transistor 162 and the gate electrode of the transistor 160 are electrically connected to each other is referred to as the node FG in some cases. When the transistor 162 is off, the node FG can be regarded as being embedded in an insulator and thus charge is held in the node FG. The off current of the transistor 162 including an oxide semiconductor can be made smaller than or equal to one hundred thousandth of an off current of a transistor including a silicon semiconductor or the like; thus, loss of the charge accumulated in the node FG due to leakage current of the transistor 162 is negligible. That is, with the transistor 162 including an oxide semiconductor, a non-volatile memory device which can hold data without being supplied with power can be realized.

For example, when the off current of the transistor 162 is less than or equal to 10 zA (1 zA (zeptoampere) is $1\times10^{-21}$ A) at room temperature (25° C.) and the capacitance value of the capacitor 164 is approximately 10 fF, data can be held for $10^4$ seconds or longer. It is needless to say that the holding time depends on transistor characteristics and the capacitance value.

Further, in the semiconductor device according to an embodiment of the disclosed invention, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limit on the number of times of writing in principle. Furthermore, a high voltage needed for writing or erasing in a conventional floating gate transistor is not necessary.

Figures 1, 1A, 2:
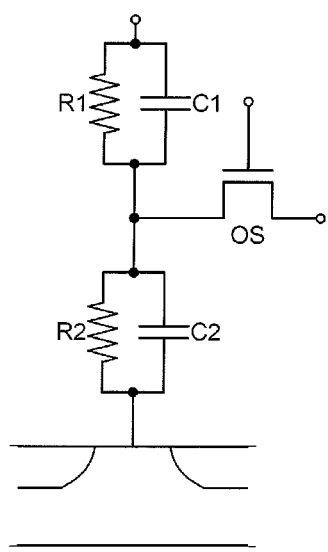
Figure 2:
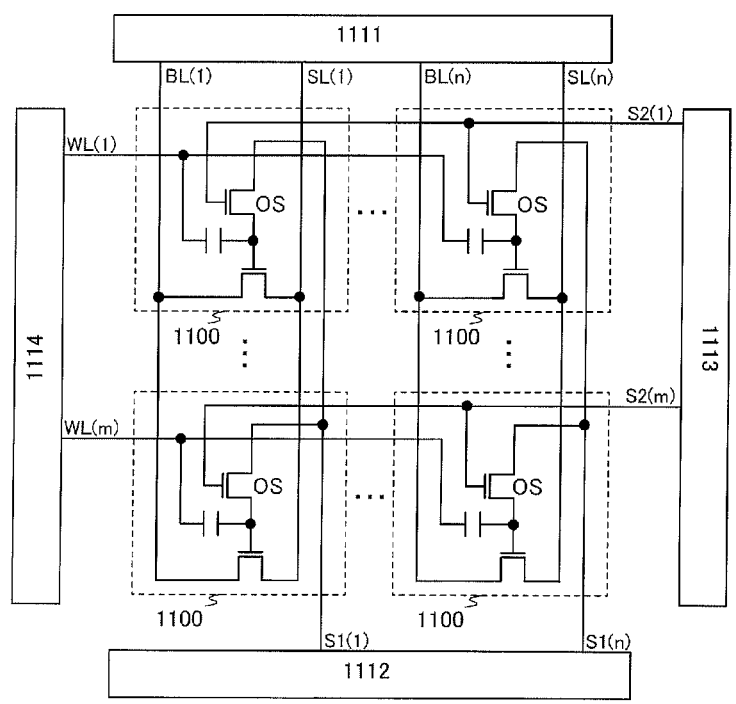

The components such as transistors in the semiconductor device in FIG. 1A-1 can be regarded as including a resistor and a capacitor as illustrated in FIG. 1A-2. That is, in FIG. 1A-2, the transistor 160 and the capacitor 164 are each regarded as including a resistor and a capacitor. R1 and C1 denote the resistance value and the capacitance value of the capacitor 164, respectively. The resistance value R1 corresponds to a resistance value which depends on an insulating layer included in the capacitor 164. R2 and C2 denote the resistance value and the capacitance value of the transistor 160, respectively. The resistance value R2 corresponds to a resistance value which depends on a gate insulating layer at the time when the transistor 160 is turned on. The capacitance value C2 corresponds to the value of a so-called gate capacitor (a capacitor formed between the gate electrode and the source electrode or the drain electrode).

The resistance value (also referred to as effective resistance) between the source electrode and the drain electrode when the transistor 162 is turned off is denoted by ROS. When R1 and R2 satisfy R1≥ROS (R1 is greater than or equal to ROS) and R2≥ROS (R2 is greater than or equal to ROS) under the condition that gate leakage current of the transistor 162 is sufficiently small, a charge holding period (also referred to as a data holding period) is determined mainly by the off current of the transistor 162.

On the other hand, when the conditions are not satisfied, it is difficult to sufficiently secure the holding period even if the off current of the transistor 162 is small enough. This is because leakage current other than the off current of the transistor 162 (e.g., leakage current generated between the source electrode and the gate electrode) is large. Accordingly, it can be said that the semiconductor device disclosed in this embodiment preferably satisfies R1≥ROS (R1 is greater than or equal to ROS) and R2≥ROS (R2 is greater than or equal to ROS).

On the other hand, it is preferable that C1 and C2 satisfy C1≥C2 (C1 is higher than or equal to C2). When C1 is large, the potential of the fifth wiring can be efficiently supplied to the node FG at the time when the potential of the node FG is controlled by the fifth wiring, and a difference between potentials (e.g., a reading potential and a non-reading potential) supplied to the fifth wiring can be reduced.

When the above relation is satisfied, a more preferable semiconductor device can be realized. Note that R1 and R2 are controlled by the gate insulating layer of the transistor 160 and the insulating layer of the capacitor 164. The same relation is applied to C1 and C2. Therefore, the material, the thickness, and the like of the gate insulating layer are preferably set as appropriate to satisfy the above relation.

In the semiconductor device described in this embodiment, the node FG has an effect similar to that of a floating gate of a floating gate transistor of a flash memory or the like, but the node FG of this embodiment has a feature which is essentially different from that of a floating gate of a flash memory or the like.

In the case of a flash memory, since potential applied to a control gate is high, it is necessary to keep a proper distance between cells in order to prevent the potential from affecting a floating gate of an adjacent cell. This is one of factors inhibiting high integration of the semiconductor device. The factor is due to a basic principle of a flash memory that tunneling current is generated by application of a high electric field.

On the other hand, the semiconductor device according to this embodiment is operated by switching of a transistor including an oxide semiconductor and does not use the above-described principle of charge injection by a tunneling current. That is, a high electrical field for charge injection is not necessary unlike a flash memory. Accordingly, it is not necessary to consider an influence of a high electrical field from a control gate on an adjacent cell, which facilitates high integration.

In addition, it is also advantageous over a flash memory that a high electrical field is unnecessary and a large peripheral circuit (such as a booster circuit) is unnecessary. For example, the highest voltage applied to the memory cell according to this embodiment (the difference between the highest potential and the lowest potential applied to respective terminals of the memory cell at the same time) can be less than or equal to 5 V, or preferably less than or equal to 3 V in each memory cell in the case where data of two levels (one bit) is written.

In addition, in the case where a dielectric constant ∈r1 of the insulating layer included in the capacitor 164 is different from a dielectric constant ∈r2 of the insulating layer included in the transistor 160, it is easy to satisfy C1≥C2 (C1 is greater than or equal to C2) while 2·S2≥S1 (2·S2 is greater than or equal to SD, preferably S2≥S1 (S2 is greater than or equal to S1) is satisfied where S1 is the area of the insulating layer included in the capacitor 164 and S2 is the area of the insulating layer forming gate capacitance in the transistor 160. In other words, C1≥C2 can be easily satisfied while the area of the insulating layer included in the capacitor 164 is small. Specifically, for example, a film formed of a high-k material such as hafnium oxide or a stack of a film formed of a high-k material such as hafnium oxide and a film formed of an oxide semiconductor is used for the insulating layer included in the capacitor 164 so that ∈r1 can be set to 10 or more, preferably 15 or more, and silicon oxide is used for the insulating layer forming the gate capacitance in the transistor 160 so that ∈r2 can be set to 3 to 4.

Combination of such structures enables higher integration of the semiconductor device according to the disclosed invention.

Note that in order to increase the memory capacity of the semiconductor device, a multilevel technique can be applied instead of increasing integration degree. For example, with a structure in which data of three levels or more are written in one memory cell, memory capacity can be increased as compared to the case where data of two stages (one bit) are written. For example, a charge Q for supplying a different potential may be supplied to a gate electrode of the transistor 160 in addition to the charge $Q_L$ for supplying a low potential and the charge $Q_H$ for supplying a high potential which are described above, whereby the multilevel technique can be realized. In this case, sufficient memory capacity can be secured even when a circuit configuration having a relatively large scale (e.g., $15F^2$ to $50F^2$ or the like (F: minimum feature size) is employed.

The structures, methods, and the like described in this embodiment can be combined as appropriate with any of the structures, methods, and the like described in the other embodiments.

[Embodiment 2]

In this embodiment, an application example of the semiconductor device described in the above embodiment will be described. Specifically, an example of a semiconductor device in which the semiconductor devices described in the above embodiment are arranged in matrix will be described.

FIG. 2 is an example of a circuit diagram of a semiconductor device which has memory capacity of m×n bits.

The semiconductor device according to an embodiment of the present invention includes a memory cell array where m word lines WL (m is a natural number), m second signal lines S2, n bit lines BL (n is a natural number), n source lines SL, n first signal lines S1, and a plurality of memory cells 1100 are arranged in matrix of m (rows) (in a vertical direction)×n (columns) (in a horizontal direction) and peripheral circuits such as a first driver circuit 1111, a second driver circuit 1112, a third driver circuit 1113, and a fourth driver circuit 1114. Here, the configuration described in the above embodiment (the configuration in FIG. 1A-1) is applied to the memory cell 1100. That is, a first transistor corresponds to the transistor 160, a second transistor corresponds to the transistor 162, and a capacitor corresponds to the capacitor 164.

That is, each of the memory cells 1100 includes a first transistor, a second transistor, and a capacitor. A gate electrode of the first transistor, one of a source electrode and a drain electrode of the second transistor, and one of electrodes of the capacitor are connected to each other. The source line and a source electrode of the first transistor are connected to each other. The bit line and a drain electrode of the first transistor are connected to each other. The first signal line and the other of the source electrode and the drain electrode of the second transistor are connected to each other. The second signal line and a gate electrode of the second transistor are connected to each other. The word line and the other of the electrodes of the capacitor are connected to each other.

Further, the memory cells 1100 are connected in parallel between the source line SL and the bit line BL. For example, the memory cell 1100 of an i-th row and a j-column (i,j) (i is an integer which is larger than or equal to 1 and smaller than or equal to m, and j is an integer which is larger than or equal to 1 and smaller than or equal to n) is connected to the source lines SL(j), the bit lines BL(j), the first signal lines S1(j), the word lines WL(i), and the second signal lines S2(i).

The n source lines SL and the n bit lines BL are connected to the first driver circuit 1111. The n first signal lines S1 are connected to the second driver circuit 1112. The m second signal lines S2 are connected to the third driver circuit 1113. The m word lines WL are connected to the fourth driver circuit 1114. Note that here, the first driver circuit 1111, the second driver circuit 1112, the third driver circuit 1113, and the fourth driver circuit 1114 are separately provided; however, the invention disclosed herein is not limited to this structure. A driver circuit having any one or some of the functions may alternatively be used.

Figures 3A, 3B:
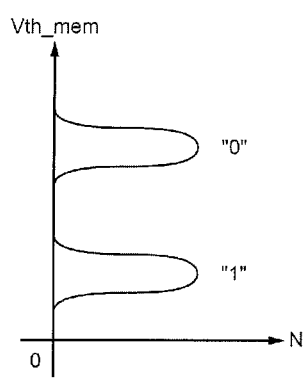
FIG. 3A is a timing chart and FIG. 3B is a distribution map of a threshold value of a memory cell.

Next, an example of writing operation and reading operation of the semiconductor device in FIG. 2 will be described with reference to a timing chart in FIG. 3A.

Although operation of the semiconductor device of two rows and two columns will be described for simplification, the disclosed invention is not limited to this.

In FIG. 3, S1(1) and S1(2) are potentials of the first signal lines S1; S2(1) and S2(2) are potentials of the second signal lines S2; BL(1) and BL(2) are potentials of the bit lines BL; WL(1) and WL(2) are potentials of the word lines WL; and SL(1) and SL(2) are potentials of the source lines SL.

First, writing to the memory cell 1100 (1,1) and the memory cell 1100 (1,2) in the first row and reading data from the memory cell 1100 (1,1) and the memory cell 1100 (1,2) in the first row will be described. Note that in the following description, it is assumed that data to be written to the memory cell (1,1) is "1" and data to be written to the memory cell (1,2) is "0".

First, the writing will be described. In a writing period of the first row, a potential $V_3$ is supplied to the second signal line S2(1) of the first row, so that the second transistors of the first row are turned on. Further, a potential of 0 V is supplied to the second signal line S2(2) of the second row, so that the second transistors of the second row are turned off.

Then, a potential $V_2$ and a potential of 0 V are supplied to the first signal line S1(1) of the first column and the first signal line S1(2) of the second column, respectively.

As a result, a potential $V_4$ and a potential of 0 V are supplied to the node FG of the memory cell (1,1) and the node FG of the memory cell (1,2), respectively. The potential $V_4$ is the same as the potential $V_2$, or is approximately equal to the potential $(V_3-V_{th2})$ ($V_{th2}$ is the threshold value of the second transistor) in the case where a potential $(V_3-V_{th2})$ is lower than the potential $V_2$. Here, the potential $V_4$ is a positive potential which is lower than the threshold value of the first transistor. Then, the potential of the second signal line S2(1) of the first row is set to 0 V, so that the second transistors of the first row are turned off. Thus, the writing is completed. Note that in this specification, the threshold value of the transistor refers to a potential difference between the gate electrode and the source electrode at the time when the transistor is changed from an on state to an off state.

Note that the word lines WL(1) and WL(2) are set to a potential of 0 V. Further, before the potential of the first signal line S1(1) of the first column is changed, the potential of the second signal line S2(1) of the first row is set to the potential of 0 V. The threshold value ($V_{th\_men}$) of the memory cell after writing is $V_{w0}$ in the case of data "0" or $V_{w1}$ in the case of data "1". As shown in FIG. 3B, the relation of $V_{w0} > V_{w1} > 0$ is satisfied in the distribution of the threshold value of the memory cell. Here, the threshold value of the memory cell refers to a potential difference between a terminal connected the word line WL and the source electrode of the first transistor, with which the first transistor is turned on.

Then, the reading will be described. In a reading period of the first row, a potential $V_5$ and a potential of 0 V are supplied to the word line WL(1) of the first row and the word line WL(2) of the second row, respectively. The potential $V_5$ is selected so that $V_{w0} > V_5 > V_{w1}$. As a result, when the potential $V_5$ is supplied to the word line WL(1), the first transistor of the memory cell in which data "0" is held is turned off, and the first transistor of the memory cell in which data "1" is held is turned on in the first row. In addition, since $V_{w0} > V_{w1} > 0$, when the potential of 0 V is supplied to the word line WL(2), in the second row, the first transistor is turned off regardless of whether data "0" or data "1" is held in the memory cell.

Further, a potential of 0 V is supplied to the source line SL(1) of the first column and the source line SL(2) of the second column.

As a result, the first transistor of the memory cell (1,1) between the bit line BL(1) and the source line SL(1) is turned on, thereby having low resistance, and the first transistors of the memory cell (1,2) and the memory cell (2,2) between the bit line BL(2) and the source line SL(2) are turned off, thereby having high resistance. A reading circuit electrically connected to the bit line BL(1) and the bit line BL(2) can read data based on a difference in resistance between the bit line and the source line.

Further, a potential of 0 V is supplied to the second signal line S2(1) and the second signal line S2(2), so that all the second transistors are turned off.

Figure 4:
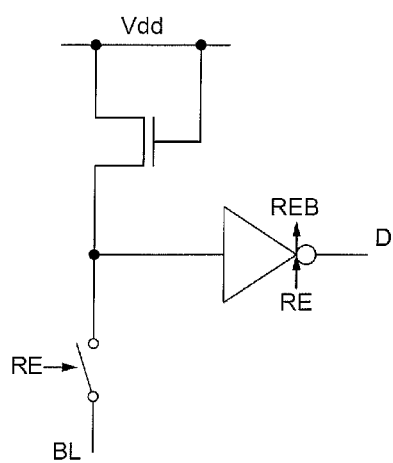
FIG. 4 is a circuit diagram of a semiconductor device.

Next, an output potential in the case where a circuit in FIG. 4 is used as a reading circuit in the first driver circuit 1111 will be described. Since the resistance between the bit line BL(1) and the source line SL(1) is low, a low potential is supplied to a clocked inverter and an output D(1) is a signal High. Since the resistance between the bit line BL(2) and the source line SL(2) is high, a high potential is supplied to the clocked inverter and an output D(2) is a signal Low.

A specific example of the potential will be described. For example, as the threshold values of the memory cell, approximately 0.6 V of $V_{w0}$ and approximately 0.2 V of $V_{w1}$ are given. With such threshold values of the memory cell, for example, the threshold value of the first transistor may be approximately 0.6 V and the potential $V_4$ at the time of writing of data "1" may be approximately 0.4 V. Examples of the operation voltages can be set as follows: $V_{dd}$=2 V, $V_2$=0.4 V, $V_3$=2 V, and $V_5$=0.4 V.

In this manner, when the state of the memory cell is set so that the potential of the gate electrode of the first transistor is intermediate between the 0 V and the threshold value $V_{th1}$ of the first transistor ($V_{th1} > 0$), writing and reading to/from the memory cell with the use of only a power supply potential of 0 V or higher is possible.

When reading is performed in the semiconductor device in FIG. 2, the memory cells of a non-selected row need to be turned off. Here, if the potential of the gate electrode of the first transistor is higher than the threshold value $V_{th1}$ of the first transistor depending on the state of the memory cell, all the memory cells are not always turned off even when a potential of 0 V is supplied to the word line WL. Therefore, it is necessary that the word line WL of the non-selected row be set to a negative potential.

However, in the semiconductor device according to an embodiment of the present invention, the potential of the gate electrode of the first transistor is lower than the threshold value $V_{th1}$ of the first transistor regardless of the memory state of the memory cell; thus, it is possible to turn off the memory cells in the non-selected row by supplying a potential of 0 V to the word line WL of the non-selected row. Accordingly, a power supply generating a negative potential does not need to be provided for the memory cell. As a result, power consumption can be reduced and the semiconductor device can be downsized.

Note that the operation method, the operation voltage, and the like relating to the semiconductor device of an embodiment of the disclosed invention are not limited to the above description and can be changed appropriately in accordance with an embodiment in which the operation of the semiconductor device is implemented.

The structures, methods, and the like described in this embodiment can be combined as appropriate with any of the structures, methods, and the like described in the other embodiments.

[Embodiment 3]

In this embodiment, a structure of a semiconductor device according to an embodiment of the disclosed invention and a method for manufacturing the semiconductor device will be described with reference to FIGS. 5A and 5B, FIGS. 6A to 6D, FIGS. 7A to 7C, FIGS. 8A to 8D, and FIGS. 9A to 9C.

<Cross-Sectional Structure and Planar Structure of Semiconductor Device>

Figure 5A:
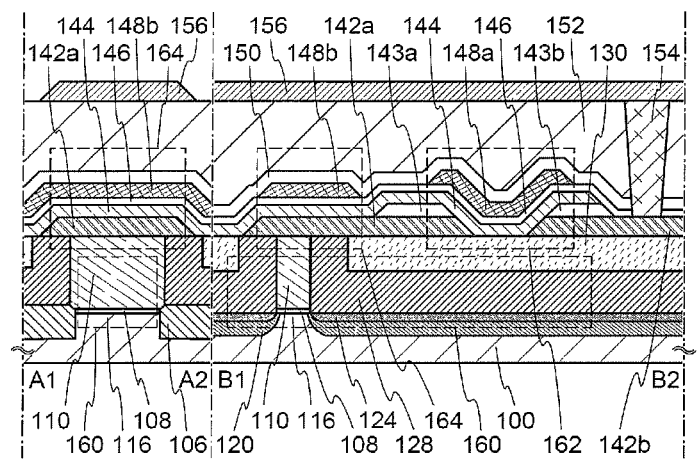
FIGS. 5A and 5B are a cross-sectional view and a plan view of a semiconductor device.
Figure 5B:
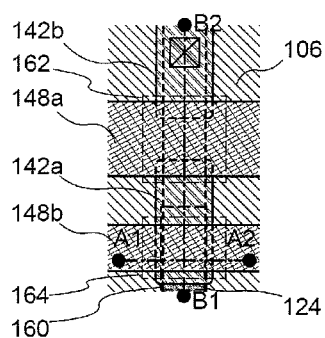

FIGS. 5A and 5B illustrate an example of a structure of a semiconductor device. FIG. 5A illustrates a cross section of the semiconductor device, and FIG. 5B illustrates a plan view of the semiconductor device. Here, FIG. 5A corresponds to a cross section along line A1-A2 and line B1-B2 in FIG. 5B. In the semiconductor device illustrated in FIGS. 5A and 5B, a transistor 160 including a first semiconductor material is included in a lower portion, and a transistor 162 including a second semiconductor material is included in an upper portion. Here, it is preferable that the first semiconductor material and the second semiconductor material be different materials. For example, the first semiconductor material can be a semiconductor material (such as silicon) other than an oxide semiconductor and the second semiconductor material can be an oxide semiconductor. A transistor including a material other than an oxide semiconductor can operate at high speed easily. On the other hand, a transistor including an oxide semiconductor can hold charge for a long time owing to its characteristics.

In this embodiment, a semiconductor material capable of sufficiently reducing off current, such as an oxide semiconductor, is used for the transistor 162 in order to hold data. However, specific conditions of the semiconductor device, such as a material used in the semiconductor device or the structure of the semiconductor device, are not necessarily limited to those described here.

The transistor 160 in FIGS. 5A and 5B includes a channel formation region 116 provided over a substrate 100 including a semiconductor material (e.g., silicon), impurity regions 120 with the channel formation region 116 provided therebetween, metal compound regions 124 in contact with the impurity regions 120, a gate insulating layer 108 provided over the channel formation region 116, and a gate electrode 110 provided over the gate insulating layer 108. An impurity element imparting a conductivity type is added to the channel formation region 116 so that the threshold voltage of the transistor 160 is positive. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". In other words, in this specification, the term "source electrode" may include a source region and the term "drain electrode" may include a drain region.

Further, element isolation insulating layers 106 are provided over the substrate 100 so as to surround the transistor 160, and an insulating layer 128 and an insulating layer 130 are provided so as to cover the transistor 160. Note that in order to obtain high integration, the transistor 160 preferably does not have a sidewall insulating layer as illustrated in FIGS. 5A and 5B. On the other hand, in the case where characteristics of the transistor 160 have priority, a sidewall insulating layer may be provided on a side surface of the gate electrode 110 and the impurity regions 120 may include an impurity region having a different impurity concentration.

The transistor 162 in FIGS. 5A and 5B includes a source or drain electrode 142a and a source or drain electrode 142b which are provided over the insulating layer 130; an oxide semiconductor layer 144 electrically connected to the source or drain electrode 142a and the source or drain electrode 142b; a gate insulating layer 146 covering the source or drain electrode 142a, the source or drain electrode 142b, and the oxide semiconductor layer 144; a gate electrode 148a provided to overlap with the oxide semiconductor layer 144, over the gate insulating layer 146; an insulating layer 143a between the source or drain electrode 142a and the oxide semiconductor layer 144, which partly overlaps with the gate electrode 148a; and an insulating layer 143b between the source or drain electrode 142b and the oxide semiconductor layer 144, which partly overlaps with the gate electrode 148a. Note that in order to reduce capacitance between the source or drain electrode and the gate electrode, it is preferable to provide the insulating layer 143a and the insulating layer 143b. However, alternatively, a structure without the insulating layer 143a and the insulating layer 143b can be employed.

Here, the oxide semiconductor layer 144 is preferably an oxide semiconductor layer which is highly purified by sufficiently removing impurities such as hydrogen or sufficiently supplying oxygen. Specifically, the hydrogen concentration of the oxide semiconductor layer 144 is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$. Note that the hydrogen concentration of the oxide semiconductor layer 144 described above is measured by secondary ion mass spectrometry (SIMS). In the oxide semiconductor layer 144 which is highly purified by sufficiently reducing the hydrogen concentration and in which defect levels in an energy gap due to oxygen deficiency are reduced by supplying a sufficient amount of oxygen, the carrier concentration is less than $1\times10^{12}$/cm$^3$, preferably less than $1\times10^{11}$/cm$^3$, more preferably less than $1.45\times10^{10}$/cm$^3$. For example, the off current (per unit channel width (1 μm) here) at room temperature (25° C.) is less than or equal to 100 zA/mm (1 zA (zeptoampere) is $1\times10^{-21}$ A), preferably less than or equal to 10 zA. In this manner, by using an oxide semiconductor which is made to be an i-type (intrinsic) oxide semiconductor or a substantially i-type oxide semiconductor, the transistor 162 which has extremely favorable off-current characteristics can be obtained.

Although the oxide semiconductor layer 144 which is processed to have an island shape is used in the transistor 162 of FIGS. 5A and 5B in order to suppress leakage current generated between elements due to miniaturization, the oxide semiconductor layer 144 is not necessarily processed to have an island shape. In the case where the oxide semiconductor layer is not processed to have an island shape, contamination of the oxide semiconductor layer 144 due to etching in processing can be prevented.

The capacitor 164 in FIGS. 5A and 5B includes the source or drain electrode 142a, the oxide semiconductor layer 144, the gate insulating layer 146, and an electrode 148b. That is to say, the source or drain electrode 142a functions as one of electrodes of the capacitor 164, and the electrode 148b functions as the other electrode of the capacitor 164.

Note that in the capacitor 164 in FIGS. 5A and 5B, insulating properties between the source or drain electrode 142a and the electrode 148b can be sufficiently secured by stacking the oxide semiconductor layer 144 and the gate insulating layer 146. The capacitor 164 may not include the oxide semiconductor layer 144 so that the capacitance can be increased. Alternatively, the insulating layer 143a may be used as a dielectric layer of the capacitor 164. Further, in the case where the capacitor is not needed, a structure without the capacitor 164 can be employed.

Note that in the transistor 162 and the capacitor 164, end portions of the source or drain electrode 142a and the source or drain electrode 142b are preferably tapered. When the edge portions of the source or drain electrode 142a and the source or drain electrode 142b are tapered, the coverage of the oxide semiconductor layer 144 can be improved and disconnection can be prevented. Here, a taper angle is, for example, greater than or equal to 30° and less than or equal to 60°. Note that the taper angle refers to an inclination angle formed with a side surface and a bottom surface of a layer having a tapered shape (for example, the source or drain electrode 142a) when seen from a direction perpendicular to a cross section (a plane perpendicular to a surface of a substrate) of the layer.

In this embodiment, the transistor 162 and the capacitor 164 are provided so as to overlap with the transistor 160. By employing such a planar layout, high integration is possible. For example, given that the minimum feature size is F, the area occupied by a memory cell can be 15F$^2$ to 25F$^2$.

An insulating layer 150 is provided over the transistor 162 and the capacitor 164 and an insulating layer 152 is provided over the insulating layer 150. An electrode 154 is provided in an opening formed in the gate insulating layer 146, the insulating layer 150, the insulating layer 152, and the like, and a wiring 156 connected to the electrode 154 is provided over the insulating layer 152. Note that in FIGS. 5A and 5B, the source or drain electrode 142b and the wiring 156 are connected to each other with the electrode 154; however, an embodiment of the disclosed invention is not limited thereto. For example, the source or drain electrode 142b may be directly in contact with the metal compound region 124. Alternatively, the wiring 156 may be directly in contact with the source or drain electrode 142b.

<Method for Manufacturing Semiconductor Device>

Next, an example of a method for manufacturing the semiconductor device will be described. First, a method for manufacturing the transistor 160 in the lower portion will be described below with reference to FIGS. 6A to 6D and FIGS. 7A to 7C, and then a method for manufacturing the transistor 162 and the capacitor 164 in the upper portion will be described with reference to FIGS. 8A to 8D and FIGS. 9A to 9C.

<Method for Manufacturing Transistor in Lower Portion>

Figure 6A:
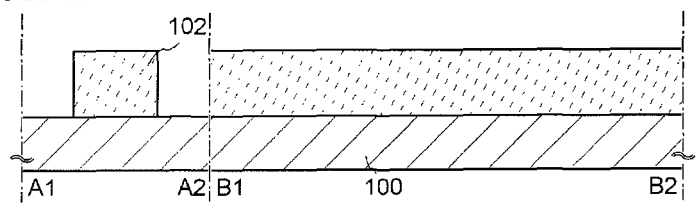
FIGS. 6A to 6D are cross-sectional views relating to steps for manufacturing a semiconductor device.
Figure 6B:
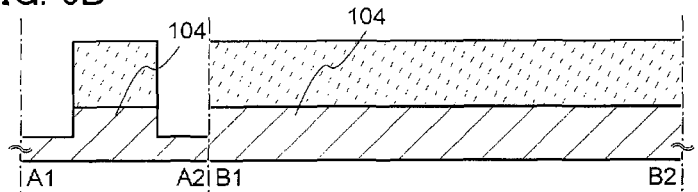

First, the substrate 100 including a semiconductor material is prepared (see FIG. 6A). As the substrate 100 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Here, an example of using a single crystal silicon substrate as the substrate 100 including a semiconductor material is described. Note that in general, the term "S01 substrate" means a substrate where a silicon layer is provided on an insulating surface. In this specification and the like, the term "SOI substrate" also means a substrate where a semiconductor layer including a material other than silicon is provided on an insulating surface. That is, a semiconductor layer included in the "SOI substrate" is not limited to a silicon layer. Moreover, the SOI substrate can be a substrate having a structure in which a semiconductor layer is provided over an insulating substrate such as a glass substrate, with an insulating layer provided therebetween.

In this embodiment, a single crystal semiconductor substrate of silicon or the like is preferably used as the substrate 100 including a semiconductor material because reading of the semiconductor device can be performed at high speed.

First, an impurity element is added to at least a region to be the channel formation region 116 of the transistor 160 later in order to control the threshold voltage of the reading transistor. Here, an impurity element imparting a conductivity type is added so that the threshold voltage of the transistor 160 is positive. For example, an impurity element imparting p-type conductivity, such as boron, aluminum, or gallium, is added to a formation region of an n-channel transistor, and an impurity element imparting n-type conductivity, such as phosphorus or arsenic, is added to a formation region of a p-channel transistor. When the above impurity is added at a dose of approximately greater than or equal to $1 \times 10^{16}$ atoms/cm$^3$ and less than or equal to $1 \times 10^{18}$ atoms/cm$^3$, the transistor 160 can have a positive threshold voltage.

Next, a protective layer 102 serving as a mask for forming an element isolation insulating layer is formed over the substrate 100 (see FIG. 6A). As the protective layer 102, an insulating layer formed using silicon oxide, silicon nitride, silicon nitride oxide, or the like can be used, for example. Note that the addition of the impurity for controlling the threshold voltage of the transistor can be performed after the protective layer 102 is formed. In addition, after the impurity is added, heat treatment is preferably performed so that activation of the impurity is performed or a defect or the like generated at the time of the addition of the impurity is repaired.

Next, part of the substrate 100 in a region that is not covered with the protective layer 102 (in an exposed region) is removed by etching with the use of the protective layer 102 as a mask. Thus, a semiconductor region 104 isolated from other semiconductor regions is formed (see FIG. 6B). As the etching, dry etching is preferably performed, but wet etching can be performed. An etching gas and an etchant can be selected as appropriate depending on a material of layers to be etched.

Figure 6C:
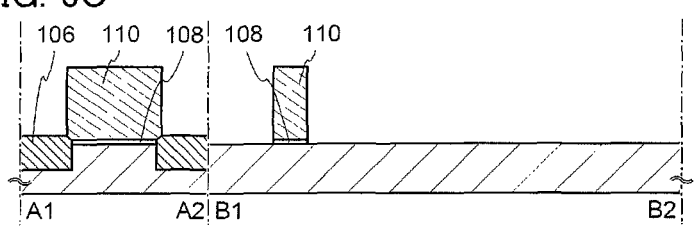

Then, an insulating layer is formed so as to cover the semiconductor region 104, and the insulating layer in a region overlapping with the semiconductor region 104 is selectively removed; thus, the element isolation insulating layers 106 are formed (see FIG. 6C). The insulating layer is formed using silicon oxide, silicon nitride, silicon oxynitride or the like. As a method for removing the insulating layer, there are etching treatment and polishing treatment such as chemical mechanical polishing (CMP), and any of them can be employed. Note that the protective layer 102 is removed after the formation of the semiconductor region 104 or after the formation of the element isolation insulating layers 106.

Next, an insulating layer is formed over a surface of the semiconductor region 104, and a layer including a conductive material is formed over the insulating layer.

The insulating layer serves as a gate insulating layer later and can be formed by performing heat treatment (thermal oxidation treatment, thermal nitridation, or the like) on the surface of the semiconductor region 104, for example. Instead of heat treatment, high-density plasma treatment may be used. The high-density plasma treatment can be performed using, for example, a mixed gas of a rare gas such as He, Ar, Kr, or Xe and a gas such as oxygen, nitrogen oxide, ammonia, nitrogen, or hydrogen. The insulating layer may be formed using a CVD method, a sputtering method, or the like. The insulating layer preferably has a single-layer structure or a stacked structure including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), and the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of deposition methods such as an evaporation method, a CVD method, a sputtering method, or a spin coating method can be employed. Note that this embodiment describes an example of the case where the layer including a conductive material is formed using a metal material.

After that, the insulating layer and the layer including a conductive material are selectively etched, so that the gate insulating layer 108 and the gate electrode 110 are formed (see FIG. 6C).

Figure 6D:
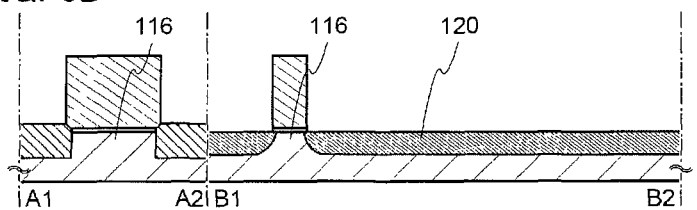

Next, phosphorus (P), arsenic (As), or the like is added to the semiconductor region 104, so that the channel formation region 116 and the impurity regions 120 are formed (see FIG. 6D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably increased when the size of a semiconductor element is extremely decreased.

Note that a sidewall insulating layer may be formed at the periphery of the gate electrode 110 and an impurity region to which an impurity element is added at a different concentration may be formed.

Figure 7A:
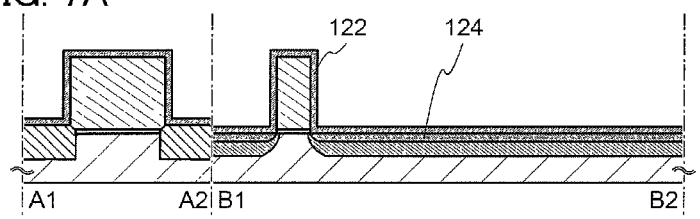
FIGS. 7A to 7C are cross-sectional views relating to steps for manufacturing a semiconductor device.

Next, a metal layer 122 is formed to cover the gate electrode 110, the impurity regions 120, and the like (see FIG. 7A). A variety of deposition methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such metal materials include titanium, tantalum, tungsten, nickel, cobalt, and platinum.

Next, heat treatment is performed so that the metal layer 122 reacts with the semiconductor material. Thus, the metal compound regions 124 that are in contact with the impurity regions 120 are formed (see FIG. 7A). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 7B:
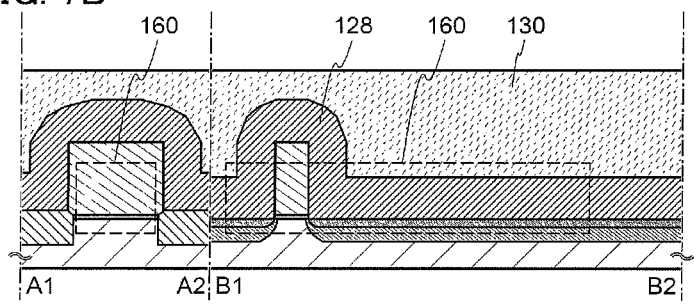

Then, the insulating layer 128 and the insulating layer 130 are formed to cover the components formed in the above steps (see FIG. 7B). The insulating layer 128 and the insulating layer 130 can be formed using a material including an inorganic insulating material such as silicon oxide, silicon oxynitride, silicon nitride, aluminum oxide. In particular, a low dielectric constant (low-k) material is preferably used for the insulating layer 128 and the insulating layer 130 because capacitance caused by an overlap of electrodes or wirings can be sufficiently reduced. Note that a porous insulating layer including any of these materials may be used for the insulating layer 128 and the insulating layer 130. Since the porous insulating layer has low dielectric constant as compared to a dense insulating layer, capacitance caused by an electrode or a wiring can be further reduced. Moreover, the insulating layer 128 and the insulating layer 130 can also be formed using an organic insulating material such as polyimide or acrylic. Note that a stacked structure of the insulating layer 128 and the insulating layer 130 is employed here; however, an embodiment of the disclosed invention is not limited to this. A single-layer structure or a stacked structure including three or more layers can also be used.

Through the above steps, the transistor 160 using the substrate 100 including a semiconductor material is formed (see FIG. 7B). Such a transistor 160 is capable of operating at high speed. Therefore, when the transistor 160 is used as a reading transistor, reading of data can be performed at high speed.

In addition, the impurity element imparting the conductivity type is added to the channel formation region 116 of the transistor 160 so that the threshold voltage is positive. Therefore, when the transistor 160 is used as a reading transistor, a power supply generating a negative potential for reading does not need to be provided for the memory cell; thus, power consumption can be reduced and the semiconductor device can be downsized. Further, operation can be performed at high speed as compared to the case of using a negative potential for reading. Note that a method for controlling the threshold voltage is not limited to the addition of the impurity to the channel formation region as long as the threshold voltage can be controlled so as to be a positive voltage.

Figure 7C:
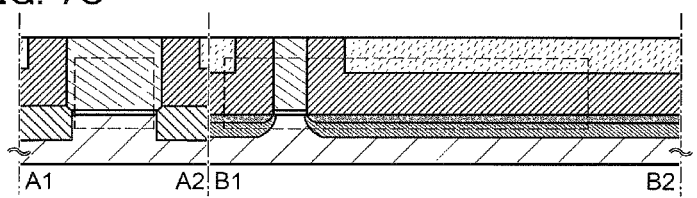

After that, as treatment before formation of the transistor 162 and the capacitor 164, CMP treatment is performed on the insulating layer 128 and the insulating layer 130, so that a top surface of the gate electrode 110 is exposed (see FIG. 7C). As the treatment for exposing the top surface of the gate electrode 110, etching treatment may be employed instead of CMP treatment. Surfaces of the insulating layer 128 and the insulating layer 130 are preferably planarized as much as possible in order to improve the characteristics of the transistor 162.

Note that before or after the above steps, steps for forming an additional electrode, wiring, semiconductor layer, insulating layer, or the like may be performed. For example, when a multi-layer structure of a stacked structure including an insulating layer and a conductive layer is employed as the structure of a wiring, a highly-integrated semiconductor device can be achieved.

<Method for Manufacturing Transistor in Upper Portion>

Figure 8A:
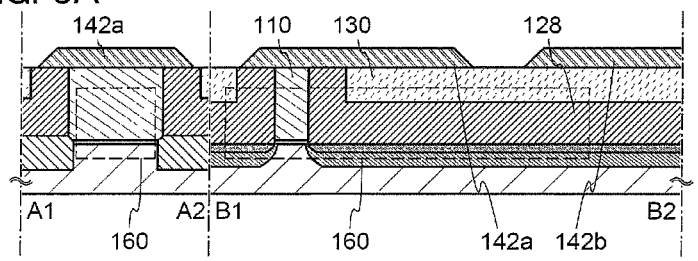
FIGS. 8A to 8D are cross-sectional views relating to steps for manufacturing a semiconductor device.

Next, a conductive layer is formed over the gate electrode 110, the insulating layer 128, the insulating layer 130, and the like, and the conductive layer is etched selectively, so that the source or drain electrode 142a and the source or drain electrode 142b are formed (see FIG. 8A).

The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. Further, one or more materials selected from manganese, magnesium, zirconium, beryllium, neodymium, and scandium may be used.

The conductive layer can have a single-layer structure or a stacked structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is contained can be used.

The conductive layer is preferably etched so that edge portions of the source or drain electrode 142a and the source or drain electrode 142b are tapered. Here, a taper angle is, for example, preferably greater than or equal to 30° and less than or equal to 60°. The etching is performed so that the end portions of the source or drain electrode 142a and the source or drain electrode 142b are tapered, whereby coverage of the gate insulating layer 146 formed later can be improved and disconnection can be prevented.

The channel length (L) of the transistor in the upper portion is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Note that an insulating layer serving as a base may be provided over the interlayer insulating layer 128 and the insulating layer 130. The insulating layer can be formed by a PVD method, a CVD method, or the like.

Figure 8B:
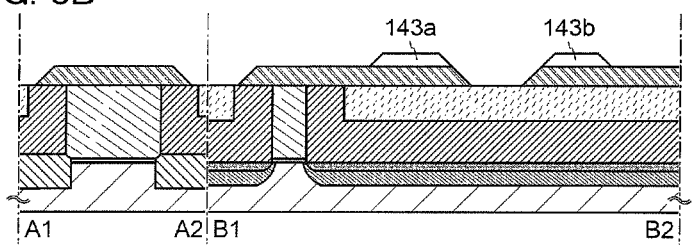

Next, the insulating layer 143a and the insulating layer 143b are formed over the source or drain electrode 142a and the source or drain electrode 142b, respectively (see FIG. 8B). The insulating layer 143a and the insulating layer 143b can be formed in such a manner that an insulating layer covering the source or drain electrode 142a and the source or drain electrode 142b is formed and the insulating layer is selectively etched. In addition, the insulating layer 143a and the insulating layer 143b are formed so as to overlap with part of the gate electrode formed later. By providing such an insulating layer, capacitance between the gate electrode and the source or drain electrode can be reduced.

The insulating layer 143a and the insulating layer 143b can be formed using a material including an inorganic insulating material such as silicon oxide, silicon oxynitride, silicon nitride, or aluminum oxide. In particular, a low dielectric constant (low-k) material is preferably used for the insulating layer 143a and the insulating layer 143b because capacitance between the gate electrode and the source or drain electrode can be reduced sufficiently. Note that a porous insulating layer including any of these materials may be used for the insulating layer 143a and the insulating layer 143b. Since the porous insulating layer has low dielectric constant as compared to a dense insulating layer, capacitance between the gate electrode and the source electrode or the drain electrode can be further reduced.

Note that in view of reducing capacitance between the gate electrode and the source or drain electrode, the insulating layer 143a and the insulating layer 143b are preferably provided. However, a structure without the insulating layers can also be employed.

Figure 8C:
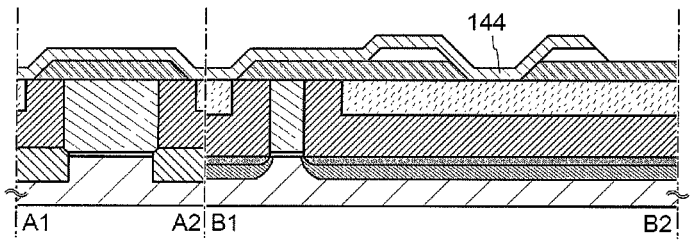

Next, an oxide semiconductor layer is formed to cover the source or drain electrode 142a and the source or drain electrode 142b, and then is selectively etched, so that the oxide semiconductor layer 144 is formed (see FIG. 8C).

As the oxide semiconductor layer can be formed using an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—-based oxide semiconductor which are two-component metal oxides; or an In—O-based oxide semiconductor; a Sn—O-based oxide semiconductor; or a Zn—O-based oxide semiconductor which are one-component metal oxides.

In particular, an In—Ga—Zn—O-based oxide semiconductor material has sufficiently high resistance when there is no electric field and thus off current can be sufficiently reduced. In addition, since field-effect mobility is high, the In—Ga—Zn—O-based oxide semiconductor material is suitable for a semiconductor device.

As an example of the In—Ga—Zn—O-based oxide semiconductor material, one represented by $InGaO_3(ZnO)_m$ (m>0) is given. Further, there is an oxide semiconductor material represented by $1 nMO_3(ZnO)_m$ (m>0) when M is used instead of Ga. Here, M denotes one or more metal elements selected from gallium (Ga), aluminum (Al), iron (Fe), nickel (Ni), manganese (Mn), cobalt (Co), or the like. For example, M can be Ga, Ga and Al, Ga and Fe, Ga and Ni, Ga and Mn, Ga and Co, or the like. Note that the above-described compositions are derived from the crystal structures that the oxide semiconductor material can have and are only examples.

It is preferable that a target having a composition expressed by the formula In:Ga:Zn=1:x:y (x is greater than or equal to 0, and y is greater than or equal to 0.5 and less than or equal to 5) be used as a target for forming the oxide semiconductor layer by a sputtering method. For example, a metal oxide target having a composition ratio of $In_2O_3$:$Ga_2O_3$:ZnO=1:1:2 [molar ratio], or the like can be used. Alternatively, a metal oxide target having a composition ratio of $In_2O_3$:$Ga_2O_3$:ZnO=1:1:1 [molar ratio], a metal oxide target having a composition ratio of $In_2O_3$:$Ga_2O_3$:ZnO=1:1:4 [molar ratio], or a metal oxide target having a composition ratio of $In_2O_3$:$Ga_2O_3$:ZnO=1:0:2 [molar ratio] can be used.

In this embodiment, the oxide semiconductor layer having an amorphous structure is formed by a sputtering method using an In—Ga—Zn—O-based metal oxide target.

It is preferable that a metal oxide contained in the metal oxide target have a relative density of higher than or equal to 80%, preferably higher than or equal to 95%, more preferably higher than or equal to 99.9%. With the use of the metal oxide target with high relative density, the oxide semiconductor layer having a dense structure can be formed.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere from which an impurity such as hydrogen, water, a hydroxyl group, or a hydride is removed so that the concentration is less than or equal to 1 ppm (preferably less than or equal to 10 ppb).

In forming the oxide semiconductor layer, for example, an object is held in a treatment chamber kept under a reduced pressure and the object is heated to a temperature higher than or equal to 100° C. and lower than 550° C., preferably higher than or equal to 200° C. and lower than or equal to 400° C. Alternatively, the temperature of the object in forming the oxide semiconductor layer may be room temperature (25° C.±10° C.). Then, moisture in the treatment chamber is removed, a sputtering gas from which hydrogen, water, and the like are removed is introduced, and the above target is used, so that the oxide semiconductor layer is formed. By forming the oxide semiconductor layer while heating the object, impurities in the oxide semiconductor layer can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By evacuation with the cryopump or the like, hydrogen, water, and the like can be removed from the treatment chamber, whereby the impurity concentration of the oxide semiconductor layer can be reduced.

The oxide semiconductor layer can be formed under the following conditions, for example: the distance between the object and the target is 170 mm; the pressure is 0.4 Pa; the direct current (DC) power is 0.5 kW; and the atmosphere is an oxygen (the proportion of the oxygen flow is 100%) atmosphere, an argon (the proportion of the argon flow is 100%) atmosphere, or a mixed atmosphere of oxygen and argon. A pulse direct current (DC) power supply is preferable because powder substances (also referred to as particles or dust) generated in the deposition can be reduced and the film thickness can be made uniform. The thickness of the oxide semiconductor layer is greater than or equal to 1 nm and less than or equal to 50 nm, preferably greater than or equal to 1 nm and less than or equal to 30 nm, more preferably greater than or equal to 1 nm and less than or equal to 10 nm. With the oxide semiconductor layer having such a thickness, a short-channel effect which occurs along with miniaturization can be suppressed. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor layer is formed by a sputtering method, a material attached to a surface over which the oxide semiconductor layer is formed (e.g., a surface of the insulating layer 130) is preferably removed by reverse sputtering in which an argon gas is introduced and plasma is generated. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object. Note that an atmosphere of nitrogen, helium, oxygen, or the like may be used instead of an argon atmosphere.

After that, heat treatment (first heat treatment) is preferably performed on the oxide semiconductor layer. Excessive hydrogen (including water and hydroxyl group) in the oxide semiconductor layer is removed by the first heat treatment and the structure of the oxide semiconductor layer is ordered, so that defect level in energy gap of the oxide semiconductor layer can be reduced. The temperature of the first heat treatment is, for example, higher than or equal to 300° C. and lower than 550° C., or higher than or equal to 400° C. and lower than or equal to 500° C. In addition, the heat treatment may be combined with heat treatment for activation of the impurities added to the channel formation region 116 of the transistor 160, or the like.

The heat treatment can be performed in such a manner that, for example, an object is introduced into an electric furnace in which a resistance heating element or the like is used and heated in a nitrogen atmosphere at 450° C. for one hour. During the heat treatment, the oxide semiconductor layer is not exposed to the air to prevent the entry of water and hydrogen.

A heat treatment apparatus is not limited to the electric furnace and may be an apparatus for heating an object by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas containing oxygen during the process. This is because defect level in energy gap due to oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

In any case, the impurities are reduced by the first heat treatment, so that the oxide semiconductor layer which is an i-type semiconductor layer (an intrinsic semiconductor layer) or a substantially i-type semiconductor layer is formed. Thus, a transistor having extremely favorable characteristics can be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be conducted once or plural times.

Etching of the oxide semiconductor layer can be performed either before or after the heat treatment. Further, in view of miniaturization of elements, dry etching is preferably performed; however, wet etching may be used. An etching gas and an etchant can be selected as appropriate depending on materials of layers to be etched. Note that in the case where leakage current of elements does not cause any problem, the oxide semiconductor layer is not necessarily processed to have an island shape.

Figure 8D:
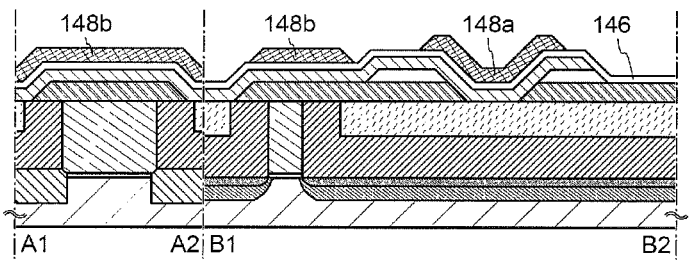

Next, the gate insulating layer 146 in contact with the oxide semiconductor layer 144 is formed, and then, over the gate insulating layer 146, the gate electrode 148a is formed in a region overlapping with the oxide semiconductor layer 144 and the electrode 148b is formed in a region overlapping with the source or drain electrode 142a (see FIG. 8D).

The gate insulating layer 146 can be formed by a CVD method, a sputtering method, or the like. The gate insulating layer 146 is preferably includes silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The gate insulating layer 146 may have a single-layer structure or a stacked structure. There is no particular limitation on a thickness thereof; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)). By using a high-k material for the gate insulating layer 146, electrical characteristics can be ensured and the thickness can be large to prevent gate leakage. Note that a stacked structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment may be performed in an inert gas atmosphere or an oxygen atmosphere. The heat treatment is performed at a temperature higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that in this embodiment, the second heat treatment is performed after the gate insulating layer 146 is formed; however, the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

At least one of the first heat treatment and the second heat treatment is employed as described above, whereby the oxide semiconductor layer 144 can be highly purified so that impurities that are not main components of the oxide semiconductor are prevented from being contained therein as much as possible.

The gate electrode 148a and the electrode 148b can be formed in such a manner that a conductive layer is formed over the gate insulating layer 146 and then etched selectively. The conductive layer to be the gate electrode 148a and the electrode 148b can be formed by a PVD method typified by a sputtering method or a CVD method such as a plasma CVD method. The details are similar to those of the source or drain electrode 142a or the like; thus, the description thereof can be referred to.

Figure 9A:
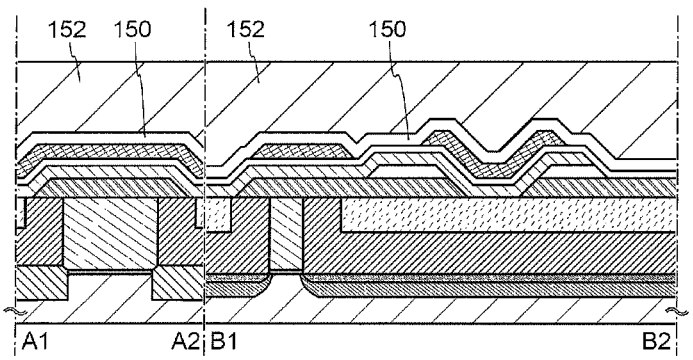
FIGS. 9A to 9C are cross-sectional views relating to steps for manufacturing a semiconductor device.

Then, the insulating layer 150 and the insulating layer 152 are formed over the gate insulating layer 146, the gate electrode 148a, and the electrode 148b (see FIG. 9A). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Note that for the insulating layer 150 and the insulating layer 152, a material with a low dielectric constant is preferably used or a structure with a low dielectric constant (e.g., a porous structure) is preferably employed. This is because the dielectric constant of the insulating layer 150 and the insulating layer 152 can be reduced, whereby the capacitance generated between wirings or electrodes can be reduced, which results in high speed operation.

Note that a stacked structure of the insulating layer 150 and the insulating layer 152 is employed in this embodiment; however, an embodiment of the disclosed invention is not limited to this. A single-layer structure or a stacked structure including three or more layers can also be used. A structure without an insulating layer may also be employed.

Note that the insulating layer 152 is preferably formed so as to have a planarized surface. This is because an electrode, a wiring, or the like can be favorably formed over the insulating layer 152 even in the case where the semiconductor device is miniaturized. The insulating layer 152 can be planarized by a method such as chemical mechanical polishing (CMP) treatment.

Figure 9B:
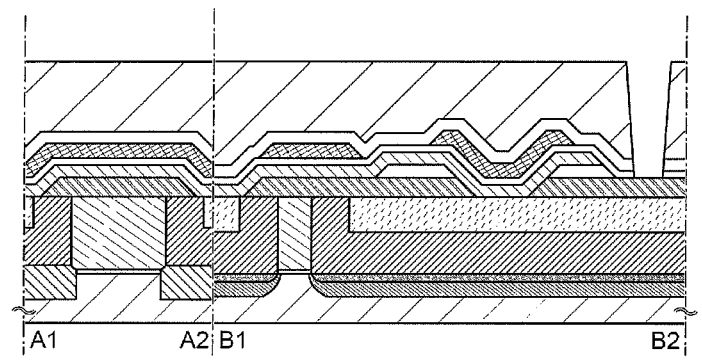

Next, an opening reaching the source or drain electrode 142b is formed in the gate insulating layer 146, the insulating layer 150, and the insulating layer 152 (see FIG. 9B). The opening is formed by selective etching with the use of a mask or the like.

Figure 9C:
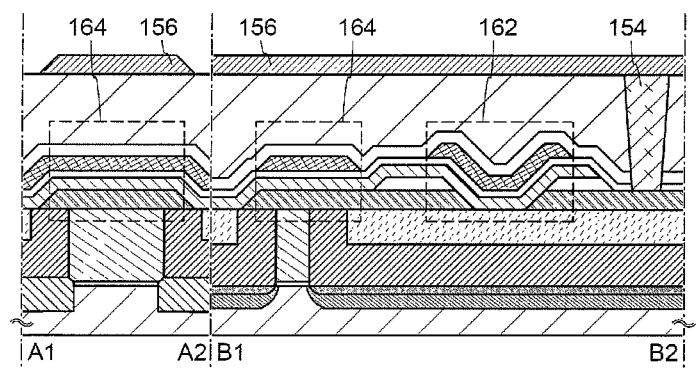

After that, the electrode 154 is formed in the opening, and the wiring 156 in contact with the electrode 154 is formed over the insulating layer 152 (see FIG. 9C).

For example, the electrode 154 can be formed in the following manner: a conductive layer is formed in a region including the opening by a PVD method, a CVD method, or the like, and then, part of the conductive layer is removed by etching treatment, CMP, or the like.

Specifically, it is possible to employ a method, for example, in which a thin titanium film is formed in a region including the opening by a PVD method and a thin titanium nitride film is formed by a CVD method, and then, a tungsten film is formed so as to be embedded in the opening. Here, the titanium film formed by a PVD method has a function of reducing an oxide film (e.g., a natural oxide film) formed on a surface over which the titanium film is formed, to decrease contact resistance with a lower electrode (here, the source or drain electrode 142b). The titanium nitride film formed after the formation of the titanium film has a barrier function of preventing diffusion of the conductive material.

A copper film may be formed by a plating method after the formation of the barrier film of titanium, titanium nitride, or the like.

Note that in the case where the electrode 154 is formed, the process is preferably performed so that the surfaces are planarized. For example, when a thin titanium film or a thin titanium nitride film is formed in a region including the opening and then a tungsten film is formed so as to be embedded in the opening, excess tungsten, titanium, titanium nitride, or the like can be removed and the planarity of the surface can be improved by subsequent CMP treatment. Favorable electrodes, wirings, insulating layers, semiconductor layers, or the like can be formed in the later steps by such an improvement in the planarity of a surface including the electrode 154.

The wiring 156 can be formed by forming a conductive layer by a PVD method such as a sputtering method, or a CVD method such as a plasma CVD method, and by patterning the conductive layer. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used. The details are the same as source electrode or drain electrode 142a.

Through the above steps, the transistor 162 including the highly-purified oxide semiconductor layer 144 and the capacitor 164 are completed (see FIG. 9D).

Since the oxide semiconductor layer 144 is highly purified in the transistor 162 illustrated in this embodiment, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. In addition, the value of the carrier concentration of the oxide semiconductor layer 144 is sufficiently low (e.g., less than $1 \times 10^{12}$/cm$^3$, preferably less than $1.45 \times 10^{10}$/cm$^3$) in comparison with that of a general silicon wafer (approximately $1 \times 10^{14}$/cm$^3$). Thus, the off current of the transistor 162 is sufficiently reduced. For example, the off current (per unit channel width (1 μm) here) at room temperature (25° C.) is less than or equal to 100 zA/μm (1 zA (zeptoampere) is $1 \times 10^{-21}$ A), preferably less than or equal to 10 zA/μm.

With the use of the highly-purified and intrinsic oxide semiconductor layer 144, sufficient reduction in the off current of the transistor is facilitated. Then, by using such a transistor, a semiconductor device in which stored data can be held for an extremely long time can be obtained.

The structures, methods, and the like described in this embodiment can be combined as appropriate with any of the structures, methods, and the like described in the other embodiments.

[Embodiment 4]

In this embodiment, application of the semiconductor device described in any of the above embodiments to an electronic device is described with reference to FIGS. 10A to 10F. In this embodiment, application of the above-described semiconductor device to electronic devices such as a computer, a mobile phone set (also referred to as a mobile phone or a mobile phone device), a portable information terminal (including a portable game machine, an audio reproducing device, and the like), a digital camera, a digital video camera, electronic paper, and a television set (also referred to as a television or a television receiver) is described.

Figure 10A:
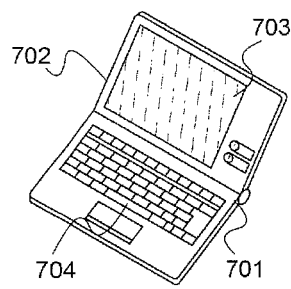
FIGS. 10A to 10F each illustrate an electronic device using a semiconductor device.

FIG. 10A illustrates a laptop personal computer that includes a housing 701, a housing 702, a display portion 703, a keyboard 704, and the like. A memory circuit is provided inside the housings 701 and 702, and the memory circuit includes the semiconductor device described in any of the above embodiments. Therefore, a laptop personal computer in which writing and reading of data are performed at high speed, data is stored for a long time, and power consumption is sufficiently reduced can be realized.

Figure 10B:
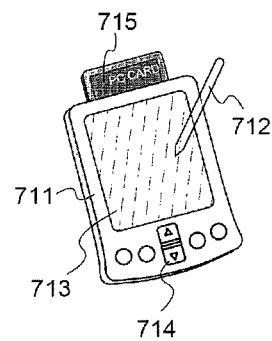

FIG. 10B illustrates a portable information terminal (personal digital assistance (PDA)). A main body 711 is provided with a display portion 713, an external interface 715, an operation button 714, and the like. Further, a stylus 712 and the like for operation of the portable information terminal are provided. A memory circuit is provided inside the main body 711, and the memory circuit includes the semiconductor device described in any of the above embodiments. Therefore, a portable information terminal in which writing and reading of data are performed at high speed, data is stored for a long time, and power consumption is sufficiently reduced can be realized.

Figure 10C:
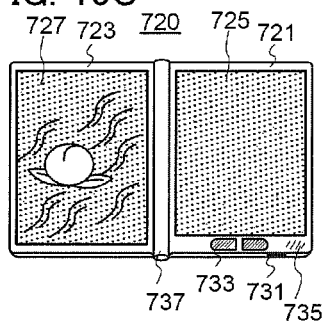

FIG. 10C illustrates an electronic book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power switch 731, an operation key 733, a speaker 735, and the like. A memory circuit is provided inside at least one of the housings 721 and 723, and the memory circuit includes the semiconductor device described in any of the above embodiments. Therefore, an electronic book reader in which writing and reading of data are performed at high speed, data is stored for a long time, and power consumption is sufficiently reduced can be realized.

Figure 10D:
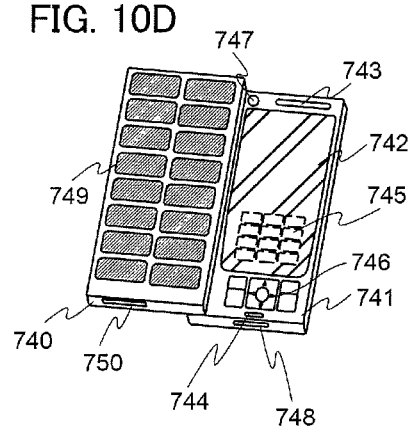

FIG. 10D illustrates a mobile phone which includes two housings, a housing 740 and a housing 741. Moreover, the housings 740 and 741 which are shown unfolded in FIG. 10D can overlap with each other by sliding; thus, the size of the mobile phone can be reduced, which makes the mobile phone suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 for charging the mobile phone, an external memory slot 750, and the like. In addition, an antenna is incorporated in the housing 741. A memory cell is provided inside at least one of the housings 740 and 741, and the memory circuit includes the semiconductor device described in any of the above embodiments. Therefore, a mobile phone in which writing and reading of data are performed at high speed, data is stored for a long time, and power consumption is sufficiently reduced can be realized.

Figure 10E:
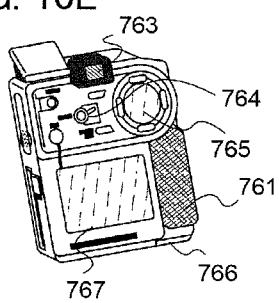

FIG. 10E illustrates a digital camera which includes a main body 761, a display portion 767, an eyepiece 763, an operation switch 764, a display portion 765, a battery 766, and the like. A memory circuit is provided inside the main body 761, and the memory circuit includes the semiconductor device described in any of the above embodiments. Therefore, a digital camera in which writing and reading of data are performed at high speed, data is stored for a long time, and power consumption is sufficiently reduced can be realized.

Figure 10F:
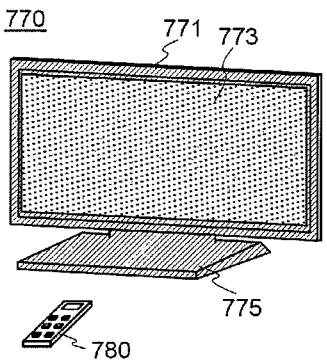

FIG. 10F illustrates a television set 770 which includes a housing 771, a display portion 773, a stand 775, and the like.

The television set 770 can be operated with an operation switch of the housing 771 or a remote controller 780. A memory circuit is provided inside the housing 771 and the remote controller 780, and the memory circuit includes the semiconductor device described in any of the above embodiments. Therefore, a television set in which writing and reading of data are performed at high speed, data is stored for a long time, and power consumption is sufficiently reduced can be realized.

As described above, a semiconductor device related to the above embodiments is mounted in the electronic devices described in this embodiment. Therefore, an electronic device whose power consumption is sufficiently reduced can be realized.

EXAMPLE 1

In this example, results obtained by measuring off current of a transistor including a highly-purified oxide semiconductor will be described.

Figure 11:
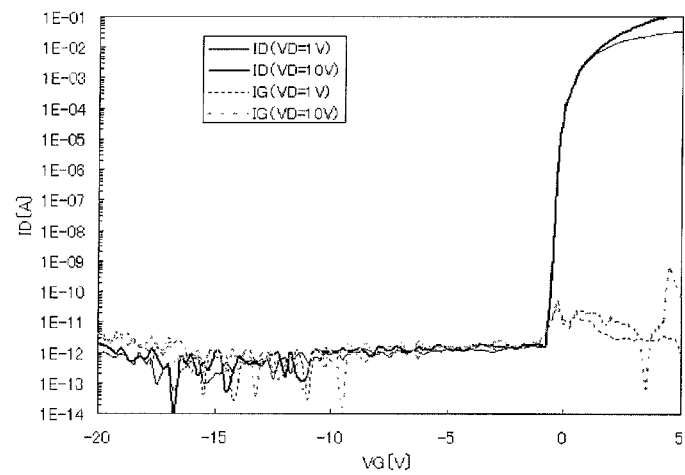
FIG. 11 is a graph showing characteristics of a transistor including an oxide semiconductor.

First, a transistor with a channel width W of 1 m, which is sufficiently wide, was prepared in consideration of the very small off current of a transistor including a highly-purified oxide semiconductor, and the off current is measured. FIG. 11 shows the results obtained by measuring the off current of the transistor with a channel width W of 1 m. In FIG. 11, the horizontal axis represents gate voltage $V_G$ and the vertical axis represents drain current $I_D$. In the case where the drain voltage $V_D$ is +1 V or +10 V and the gate voltage $V_G$ is within the range of −5 V to −20 V, the off current of the transistor was found to be less than or equal to $1 \times 10^{-12}$ A which is the detection limit. Moreover, it was found that the off current of the transistor (per unit channel width (1 μm) here) is less than or equal to 1 aA/μm ($1 \times 10^{-18}$ A/μm).

Described next are the results obtained by more accurately measuring the off current of the transistor including a highly-purified oxide semiconductor. As described above, it was found that the off current of the transistor including a highly-purified oxide semiconductor is less than or equal to $1 \times 10^{-12}$ A which is the detection limit of a measuring device. Here, the results of measuring more accurate off-state current (a value less than or equal to the detection limit of measurement device in the above measurement), with the use of an element for characteristic evaluation, are described.

First, the element for characteristic evaluation which is used in a method for measuring current is described with reference to FIG. 12.

Figure 12:
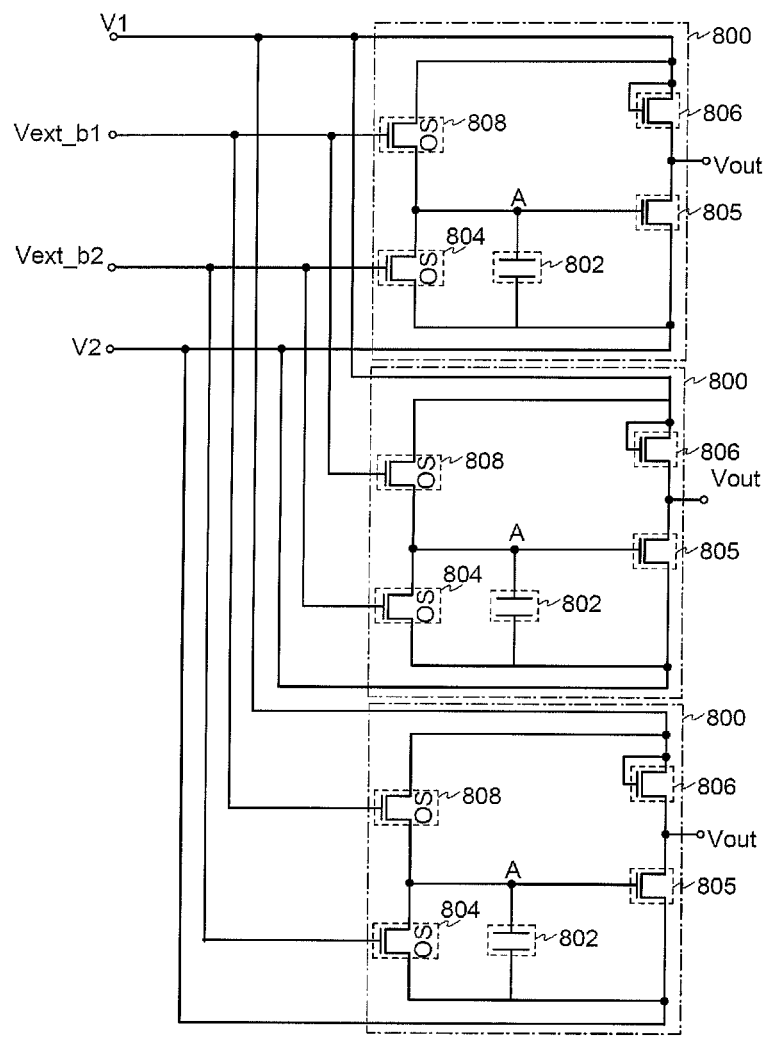
FIG. 12 is a diagram of a circuit for evaluating characteristics of a transistor including an oxide semiconductor.

In the element for characteristic evaluation in FIG. 12, three measurement systems 800 are connected in parallel. The measurement system 800 includes a capacitor 802, a transistor 804, a transistor 805, a transistor 806, and a transistor 808. A transistor including a highly-purified oxide semiconductor was used as each of the transistors 804 and 808.

In the measurement system 800, one of a source terminal and a drain terminal of the transistor 804, one of terminals of the capacitor 802, and one of a source terminal and a drain terminal of the transistor 805 are connected to a power source (for supplying $V_2$). The other of the source terminal and the drain terminal of the transistor 804, one of a source terminal and a drain terminal of the transistor 808, the other of the terminals of the capacitor 802, and a gate terminal of the transistor 805 are connected to each other. The other of the source terminal and the drain terminal of the transistor 808, one of a source terminal and a drain terminal of the transistor 806, and a gate terminal of the transistor 806 are connected to a power source (for supplying $V_1$). The other of the source terminal and the drain terminal of the transistor 805, the other of the source terminal and the drain terminal of the transistor 806 are connected to each other, and the node serves as an output terminal.

A potential $V_{ext\_b2}$ for controlling an on state and an off state of the transistor 804 is supplied to the gate terminal of the transistor 804. A potential $V_{ext\_b1}$ for controlling an on state and an off state of the transistor 808 is supplied to the gate terminal of the transistor 808. A potential $V_{out}$ is output from the output terminal.

Next, a method for measuring current with the use of the element for characteristic evaluation is described.

First, an initialization period in which a potential difference is applied to measure the off current is described briefly. In the initialization period, the potential $V_{ext\_b1}$ for turning on the transistor 808 is input to the gate terminal of the transistor 808, and a potential $V_1$ is supplied to a node A that is a node connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential $V_1$ is, for example, a high potential. The transistor 804 is kept in an off state.

After that, the potential $V_{ext\_b1}$ for turning off the transistor 808 is input to the gate terminal of the transistor 808 so that the transistor 808 is turned off. After the transistor 808 is turned off, the potential $V_1$ is set to low. Still, the transistor 804 is kept in an off state. The potential V, is the same potential as $V_1$. Thus, the initialization period is completed. When the initialization period is finished, a potential difference is generated between the node A and one of a source electrode and a drain electrode of the transistor 804. In addition, a potential difference is generated between the node A and the other of the source electrode and the drain electrode of the transistor 808. Accordingly, a small amount of charge flows through the transistor 804 and the transistor 808. That is, the off current flows.

Next, a measurement period of the off current is briefly described. In the measurement period, the potential (that is, $V_2$) of one of the source terminal and the drain terminal of the transistor 804 and the potential (that is, $V_1$) of the other of the source terminal and the drain terminal of the transistor 808 are set to low and fixed. On the other hand, the potential of the node A is not fixed (the node A is in a floating state) in the measurement period. Accordingly, charge flows through the transistor 804, and the amount of charge held in the node A is changed as time passes. The potential of the node A is changed depending on the change in the amount of charge held in the node A. That is to say, the output potential $V_{out}$ of the output terminal is also changed.

Figure 13:
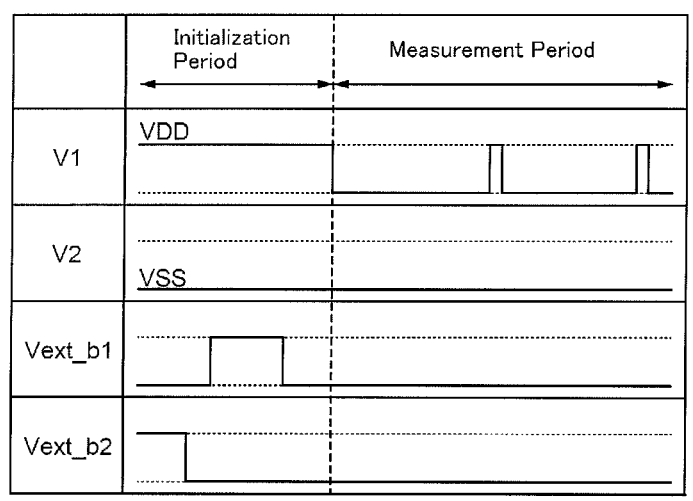
FIG. 13 is a timing chart for evaluating characteristics of a transistor including an oxide semiconductor.

FIG. 13 shows details of the relation between potentials in the initialization period in which the potential difference is applied and in the following measurement period (timing chart).

In the initialization period, first, the potential $V_{ext\_b2}$ is set to a potential (high potential) at which the transistor 804 is turned on. Thus, the potential of the node A comes to be $V_2$, that is, a low potential ($V_{SS}$). Note that a low potential ($V_{SS}$) is not necessarily supplied to the node A. After that, the potential $V_{ext\_b2}$ is set to a potential (low potential) at which the transistor 804 is turned off, whereby the transistor 804 is turned off. Next, the potential $V_{ext\_b1}$ is set to a potential (a high potential) at which the transistor 808 is turned on. Thus, the potential of the node A comes to be $V_1$, that is, a high potential ($V_{DD}$). After that, the potential $V_{ext\_b1}$ is set to a potential at which the transistor 808 is turned off. Accordingly, the node A is brought into a floating state and the initialization period is completed.

In the following measurement period, the potential $V_1$ and the potential $V_2$ are individually set to potentials at which charge flows to or from the node A. Here, the potential $V_1$ and the potential $V_2$ are low potentials ($V_{SS}$). Note that at the timing of measuring the output potential $V_{out}$, it is necessary to operate an output circuit; thus, $V_1$ is set to a high potential ($V_{DD}$) temporarily in some cases. The period in which $V_1$ is a high potential ($V_{DD}$) is set to be short so that the measurement is not influenced.

When the potential difference is generated and the measurement period is started as described above, the amount of charge stored in the node A is changed as time passes, which changes the potential of the node A. This means that the potential of a gate terminal of the transistor 805 changes and thus, the output potential $V_{out}$ of the output terminal also changes as time passes.

A method for calculating the off current on the basis of the obtained output potential $V_{out}$ is described below.

The relation between the potential $V_A$ of the node A and the output potential $V_{out}$ is obtained in advance before the off current is calculated. With this, the potential $V_A$ of the node A can be obtained using the output potential $V_{out}$. In accordance with the above relation, the potential $V_A$ of the node A can be expressed as a function of the output potential $V_{out}$ by the following formula.

$$V_A = F(Vout) \quad \text{[FORMULA 1]}$$

A charge $Q_A$ of the node A can be expressed by the following formula with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[FORMULA 2]}$$

Since a current $I_A$ of the node A is obtained by differentiating charge flowing to the node A (or charge flowing from the node A) with respect to time, the current $I_A$ of the node A is expressed by the following formula.

$$I_A = \frac{\Delta Q_A}{\Delta t} = \frac{C_A \cdot \Delta F(Vout)}{\Delta t} \quad \text{[FORMULA 3]}$$

In this manner, the current $I_A$ of the node A can be obtained from the capacitance $C_A$ connected to the node A and the output potential $V_{out}$ of the output terminal.

In accordance with the above method, it is possible to measure leakage current (off current) which flows between a source and a drain of a transistor in an off state.

In this example, the transistor 804, the transistor 805, the transistor 806, and the transistor 808 with a channel length L of 10 μm and a channel width W of 50 μm were manufactured using a highly-purified oxide semiconductor. In addition, in the measurement systems 800 which are arranged in parallel, the capacitances of the capacitors 802 were 100 fF, 1 pF, and 3 pF.

Note that the measurement according to this example was performed assuming that $V_{DD}$=5 V and $V_{SS}$=0 V are satisfied. In the measurement period, the potential $V_1$ was basically set to V55 and set to $V_{DD}$ only in a period of 100 msec every 10 sec to 300 sec, and $V_{out}$ was measured. Further, Δt which was used in calculation of current I which flows through the element was about 30000 sec.

Figure 14:
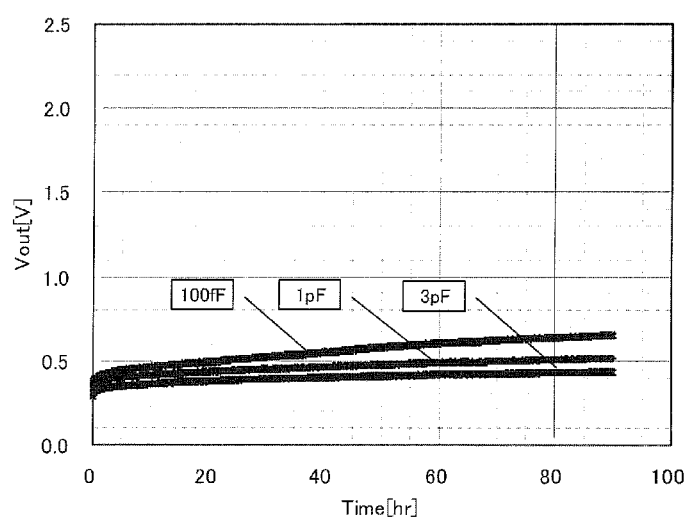
FIG. 14 is a graph showing characteristics of a transistor including an oxide semiconductor.

FIG. 14 shows the relation between the output potential $V_{out}$ and elapsed time Time in the current measurement. According to FIG. 14, the potential varies as time passes.

Figure 15:
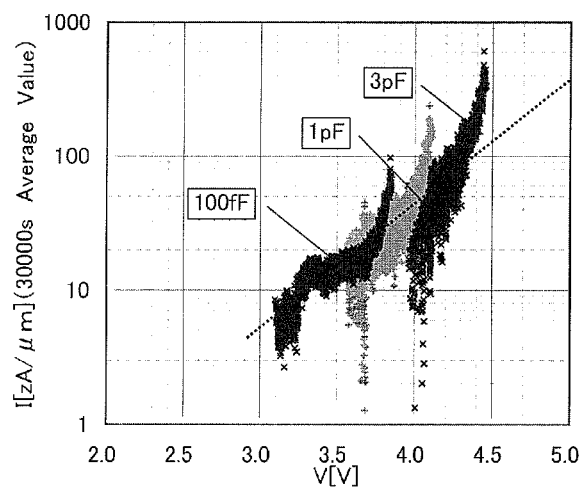
FIG. 15 is a graph showing characteristics of a transistor including an oxide semiconductor.

FIG. 15 shows the off current at room temperature (25° C.) calculated based on the above current measurement. FIG. 15 shows the relation between source-drain voltage V and off current I. According to FIG. 15, the off current was about 40 zA/μm under the condition that the source-drain voltage was 4 V. In addition, the off current was less than or equal to 10 zA/μm under the condition where the source-drain voltage was 3.1 V. Note that 1 zA represents $10^{-21}$ A.

Figure 16:
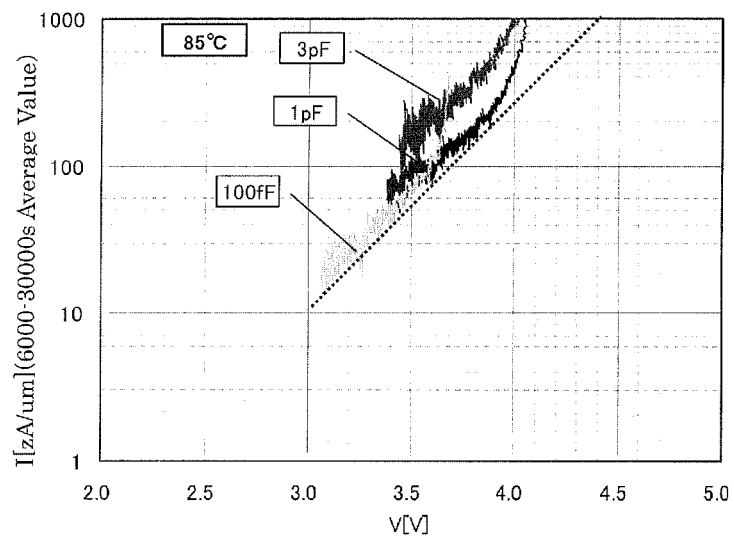
FIG. 16 is a graph showing characteristics of a transistor including an oxide semiconductor.

Further, FIG. 16 shows the off current in an environment at a temperature of 85° C., which was calculated based on the above current measurement. FIG. 16 shows the relation between source-drain voltage V and off current I in the environment at a temperature of 85° C. According to FIG. 16, the off current was about 100 zA/μm under the condition where the source-drain voltage was 3.1 V.

According to this example, it was confirmed that the off current can be sufficiently small in a transistor including a highly-purified oxide semiconductor.

EXAMPLE 2

The number of times the memory cell according to an embodiment of the disclosed invention can be rewritten was examined. In this example, the examination results will be described with reference to FIGS. 17A to 17C.

A semiconductor device used for the examination is the semiconductor device having the circuit configuration illustrated in FIG. 1A-1. Here, an oxide semiconductor was used for a transistor corresponding to the transistor 162. A capacitor with a capacitance value of 0.33 pF was used as a capacitor corresponding to the capacitor 164.

Data was held and written in the memory cell by applying 0 V or 5 V to a wiring corresponding to the third wiring in FIG. 1A-1 and applying 0 V or 5 V to a wiring corresponding to the fourth wiring. When the potential of the wiring corresponding to the fourth wiring is 0 V, the transistor (writing transistor) corresponding to the transistor 162 is in an off state; thus, a potential supplied to a node FG is held. When the potential of the wiring corresponding to the fourth wiring is 5 V, the transistor corresponding to the transistor 162 is in an on state; thus, a potential of the wiring corresponding to the third wiring is supplied to the node FG.

Figure 17A:
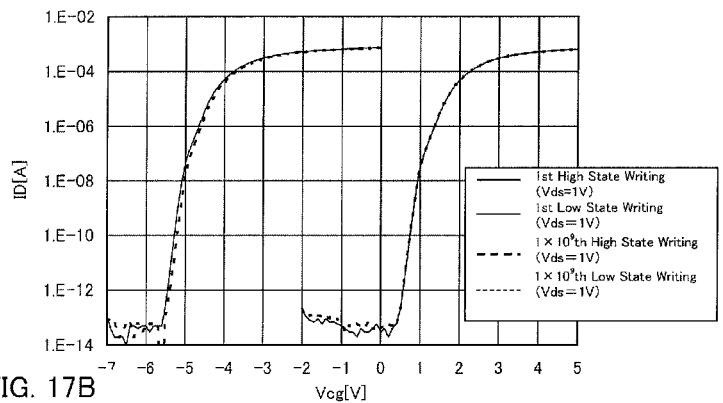
FIGS. 17A to 17C are graphs showing examination results of a memory window width.

FIG. 17A shows curves ($V_{cg}$–$I_d$ curves) of the relation between a potential $V_{cg}$ of a wiring corresponding to the fifth wiring and a drain current $I_d$ of a transistor (a reading transistor) corresponding to the transistor 160 before and after 1×10⁹ times of writing. In FIG. 17A, "writing in a low state" indicates that 0 V is applied to the node FG whereas "writing in a high state" indicates that 5 V is applied to the node FG. Note that in FIG. 17A, the horizontal axis shows $V_{cg}$ (V) and the vertical axis shows $I_d$ (A).

As in FIG. 17A, the $V_{cg}$–$I_d$ curves of both writing in a low state and writing in a high state hardly change before and after 1×10⁹ times of writing. In addition, the shift amount ($\Delta V_{cg}$) between the curve of writing in a high state and the $V_{cg}$–$I_d$ curve of writing in a low state hardly change before and after 1×10⁹ times of writing.

Figure 17B:
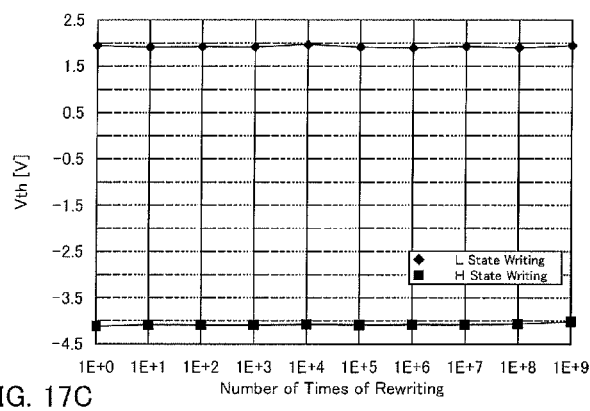

FIG. 17B illustrates the relation between a potential of the wiring corresponding to the fifth wiring which is needed to turn on the transistor 160 for wiring in a high state and writing in a low state, and the number of times of rewriting. In FIG. 17B, the horizontal axis represents the number of times of rewriting and the vertical axis represents the potential of the wiring corresponding to the fifth wiring, that is, the apparent threshold value $V_{th}$ (V) of the transistor 160.

Note that the threshold value can be generally obtained by a tangent method. Specifically, in the graph where the horizontal axis represents the gate voltage $V_g$ and the vertical axis represents the square root of the drain current $I_d$, the tangent to the point of maximum slope of the curve is obtained. The horizontal axis (the value of the gate voltage $V_g$) intercept of the tangent is the threshold value. Also in FIG. 17B, the apparent threshold value $V_{th}$ was obtained by a tangent method.

The memory window widths obtained from FIG. 17B are given in Table 1. Note that the memory window widths, which was obtained by calculation, is the difference between the apparent threshold value $V_{th\_H}$ of the transistor 160 in the case of writing in a high state and the apparent threshold value $V_{th\_L}$ of the transistor 160 in the case of writing in a low state.

TABLE 1

| | Number of Writing Times | | | | | | | | |
|---|---|---|---|---|---|---|---|---|---|
| | 1.E+00 | 1.E+01 | 1.E+02 | 1.E+03 | 1.E+04 | 1.E+05 | 1.E+06 | 1.E+07 | 1.E+08 | 1.E+09 |
| Width of Memory Window | 6.06 | 6.00 | 6.01 | 6.01 | 6.04 | 6.00 | 5.98 | 6.01 | 5.96 | 5.96 |

As is seen in Table 1, in the memory cell of this example, the memory window width is changed by 2% or less, specifically 1.68%, before and after $1 \times 10^9$ times of writing. Therefore, it was shown that the semiconductor device is not deteriorated at least before and after $1 \times 10^9$ times of writing.

Figure 17C:
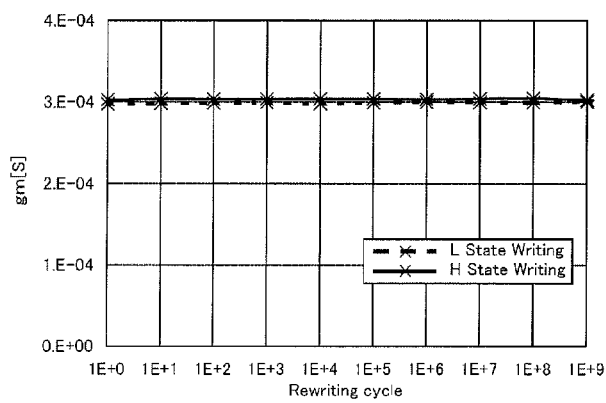

FIG. 17C shows a relation between the number of times of rewriting and the mutual conductance (gm) of the memory cell. In FIG. 17C, the horizontal axis represents the number of times of rewriting and the vertical axis represents the mutual conductance (gm).

Reduction in the mutual conductance (gm) of the memory cell causes an influence such as difficulty in discrimination between a writing state and an erasing state; however, in the memory cell of this example, the value of gm hardly changes even with $1 \times 10^9$ times of rewriting, as in FIG. 17C. Accordingly, the semiconductor device according to this example is a semiconductor device having extremely high reliability which is not deteriorated even with $1 \times 10^9$ times of rewriting.

As described above, in a memory cell according to an embodiment of the disclosed invention has extremely high rewriting durability and its characteristics do not change even when data is held and written as much as $1 \times 10^9$ times. That is, it can be said that a memory cell having extremely high reliability and a semiconductor device which includes the memory cell and has extremely high reliability are realized according to an embodiment of the disclosed invention.

This application is based on Japanese Patent Application serial no. 2010-041852 filed with Japan Patent Office on Feb. 26, 2010, the entire contents of which are hereby incorporated by reference.

The invention claimed is:

1. A semiconductor device comprising:
a source line;
a bit line;
a first signal line;
a second signal line;
a word line; and
a memory cell connected between the source line and the bit line,
wherein the memory cell comprises:
    a first transistor comprising a first gate electrode, a first source electrode, a first drain electrode, and a first channel formation region;
    a second transistor comprising a second gate electrode, a second source electrode, a second drain electrode, and a second channel formation region; and
    a capacitor,
wherein the first channel formation region includes an impurity element imparting a conductivity type so that a threshold voltage of the first transistor is positive,
wherein the first gate electrode, the second drain electrode, and one of electrodes of the capacitor are electrically connected to each other to form a node for holding charge,
wherein the source line is electrically connected to the first source electrode,
wherein the bit line is electrically connected to the first drain electrode,
wherein the first signal line is electrically connected to the second source electrode,
wherein the second signal line is electrically connected to the second gate electrode, and
wherein the word line is electrically connected to the other of the electrodes of the capacitor,
wherein the first channel formation region includes single crystal silicon,
wherein the second channel formation region includes an oxide semiconductor, and
wherein an off current of the second transistor is less than or equal to 10 zA at room temperature.

2. The semiconductor device according to claim 1, wherein one of a plurality of kinds of charges for controlling conductance of the first transistor is supplied to the node.

3. The semiconductor device according to claim 1, wherein when a potential of 0 V is supplied to the word line, the threshold voltage of the first transistor is a voltage at which the first transistor is turned off regardless of the charge held in the node.

4. The semiconductor device according to claim 1, wherein at least one of boron, aluminum, and gallium is added as the impurity element.

5. The semiconductor device according to claim 1, wherein the oxide semiconductor comprises In, Ga and Zn.

6. The semiconductor device according to claim 1, wherein a carrier concentration in the oxide semiconductor is less than $1 \times 10^{12}/cm^3$.

7. A semiconductor device comprising:
a memory cell comprising:
    a first transistor comprising a first gate electrode, a first source electrode, a first drain electrode, and a first channel formation region wherein the first transistor has a positive threshold voltage;

a second transistor comprising a second gate electrode, a second source electrode, a second drain electrode, and a second channel formation region wherein the second channel formation region has a different semiconductor material from the first channel formation region and has an energy gap of greater than 3 eV; and a capacitor including a first electrode and a second electrode, a source line electrically connected to the first source electrode;

a bit line electrically connected to the first drain electrode, a first signal line electrically connected to the second source electrode, a second signal line electrically connected to the second gate electrode, and a word line electrically connected to the first electrode of the capacitor, wherein the first gate electrode, the second drain electrode and the second electrode of the capacitor are electrically connected to each other to form a node for holding charge, wherein the first channel formation region includes single crystal silicon, and wherein the second channel formation region comprises an oxide semiconductor, wherein an off current of the second transistor is less than or equal to 10 zA at room temperature.

8. The semiconductor device according to claim 7 wherein the first channel formation region is formed in a silicon substrate.

9. The semiconductor device according to claim 7 wherein the first channel formation region is formed in an SOI substrate.

10. The semiconductor device according to claim 7 further comprising a driver circuit operationally connected to at least the bit line to read data of the memory cell.

11. The semiconductor device according to claim 7, wherein the first channel formation region includes at least one of boron, aluminum, and gallium.

12. The semiconductor device according to claim 7, wherein a carrier concentration in the oxide semiconductor is less than $1\times10^{12}/cm^3$.

13. A semiconductor device comprising:
a memory cell comprising:
a first transistor comprising a first gate electrode, a first source electrode, a first drain electrode, and a first channel formation region comprising single crystal silicon, wherein the first transistor has a positive threshold voltage;

an insulating layer formed over at least a part of the first transistor;

a second transistor over the insulating layer, the second transistor comprising a second gate electrode, a second source electrode, a second drain electrode, and a second channel formation region wherein the second channel formation region comprises an oxide semiconductor, wherein the first gate electrode and the second drain electrode are electrically connected to each other to form a node for holding charge, and wherein an off current of the second transistor is less than or equal to 10 zA at room temperature.

14. The semiconductor device according to claim 13 further comprising a capacitor formed over the insulating layer, the capacitor including a first electrode and a second electrode, wherein the first electrode is electrically connected to the first gate electrode and the second drain electrode to form the node.

15. The semiconductor device according to claim 13 wherein the first channel formation region is formed in a silicon substrate.

16. The semiconductor device according to claim 13 wherein the first channel formation region is formed in an SOI substrate.

17. The semiconductor device according to claim 13, wherein the first channel formation region includes at least one of boron, aluminum, and gallium.

18. The semiconductor device according to claim 14 wherein the capacitor further includes a second insulating layer formed from a same layer as a gate insulating layer of the second transistor, the second insulating layer interposed between the first electrode and the second electrode.

19. The semiconductor device according to claim 14 wherein the capacitor further includes a second insulating layer formed from a same layer as a gate insulating layer of the second transistor, the second insulating layer interposed between the first electrode and the second electrode and comprising hafnium oxide.

20. The semiconductor device according to claim 13 wherein the memory cell is non-volatile.

21. The semiconductor device according to claim 13, wherein a carrier concentration in the oxide semiconductor is less than $1\times10^{12}/cm^3$.

* * * * *